(12) United States Patent
Harada et al.

(10) Patent No.: US 9,845,549 B2
(45) Date of Patent: Dec. 19, 2017

(54) METHOD OF MANUFACTURING SILICON CARBIDE SINGLE CRYSTAL

(71) Applicant: SUMITOMO ELECTRIC INDUSTRIES, LTD., Osaka-shi, Osaka (JP)

(72) Inventors: Shin Harada, Itami (JP); Tsutomu Hori, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 169 days.

(21) Appl. No.: 14/804,438

(22) Filed: Jul. 21, 2015

(65) Prior Publication Data
US 2016/0122902 A1  May 5, 2016

(30) Foreign Application Priority Data

Oct. 31, 2014  (JP) .................................. 2014-223158
Nov. 4, 2014   (JP) .................................. 2014-224420
Nov. 4, 2014   (JP) .................................. 2014-224421

(51) Int. Cl.
*C30B 23/06* (2006.01)
*C30B 29/36* (2006.01)

(52) U.S. Cl.
CPC ............ *C30B 23/066* (2013.01); *C30B 29/36* (2013.01)

(58) Field of Classification Search
CPC combination set(s) only.
See application file for complete search history.

(56) References Cited

U.S. PATENT DOCUMENTS

| 2005/0178316 A1* | 8/2005 | Kandler | ................... C30B 11/00 117/13 |
| 2010/0139552 A1* | 6/2010 | Rengarajan | .............. C30B 23/06 117/84 |
| 2012/0000414 A1* | 1/2012 | Bondokov | ............ C30B 23/002 117/84 |

FOREIGN PATENT DOCUMENTS

| JP | 2012-510951 A | 5/2012 |
| WO | WO-2010/077639 A2 | 7/2010 |

* cited by examiner

*Primary Examiner* — Duy Deo
*Assistant Examiner* — Erin Bergner
(74) *Attorney, Agent, or Firm* — Drinker Biddle & Reath LLP

(57) ABSTRACT

A crucible having a top surface, a bottom surface opposite to the top surface, and a tubular side surface located between the top surface and the bottom surface, a resistive heater provided outside of the crucible and made of carbon, a source material provided in the crucible, and a seed crystal provided to face the source material in the crucible are prepared. A silicon carbide single crystal is grown on the seed crystal by sublimating the source material with the resistive heater. In the step of growing a silicon carbide single crystal, a value obtained by dividing a value of a current flowing through the resistive heater by a cross-sectional area of the resistive heater perpendicular to a direction in which the current flows is maintained at 5 A/mm$^2$ or less.

9 Claims, 25 Drawing Sheets

METHOD OF MANUFACTURING SILICON CARBIDE SINGLE CRYSTAL

BACKGROUND OF THE INVENTION

Field of the Invention

The present disclosure relates to methods of manufacturing silicon carbide single crystals.

Description of the Background Art

Japanese National Patent Publication No. 2012-510951 describes a method of manufacturing a silicon carbide single crystal by sublimation using a crucible made of graphite.

SUMMARY OF THE INVENTION

A method of manufacturing a silicon carbide single crystal according to the present disclosure includes the following steps. A crucible having a top surface, a bottom surface opposite to the top surface, and a tubular side surface located between the top surface and the bottom surface, a resistive heater provided outside of the crucible and made of carbon, a source material provided in the crucible, and a seed crystal provided to face the source material in the crucible are prepared. A silicon carbide single crystal is grown on the seed crystal by sublimating the source material with the resistive heater. In the step of growing a silicon carbide single crystal, a value obtained by dividing a value of a current flowing through the resistive heater by a cross-sectional area of the resistive heater perpendicular to a direction in which the current flows is maintained at 5 $A/mm^2$ or less.

DETAILED DESCRIPTION OF THE INVENTION

1. Description of Embodiments

Figure 1:
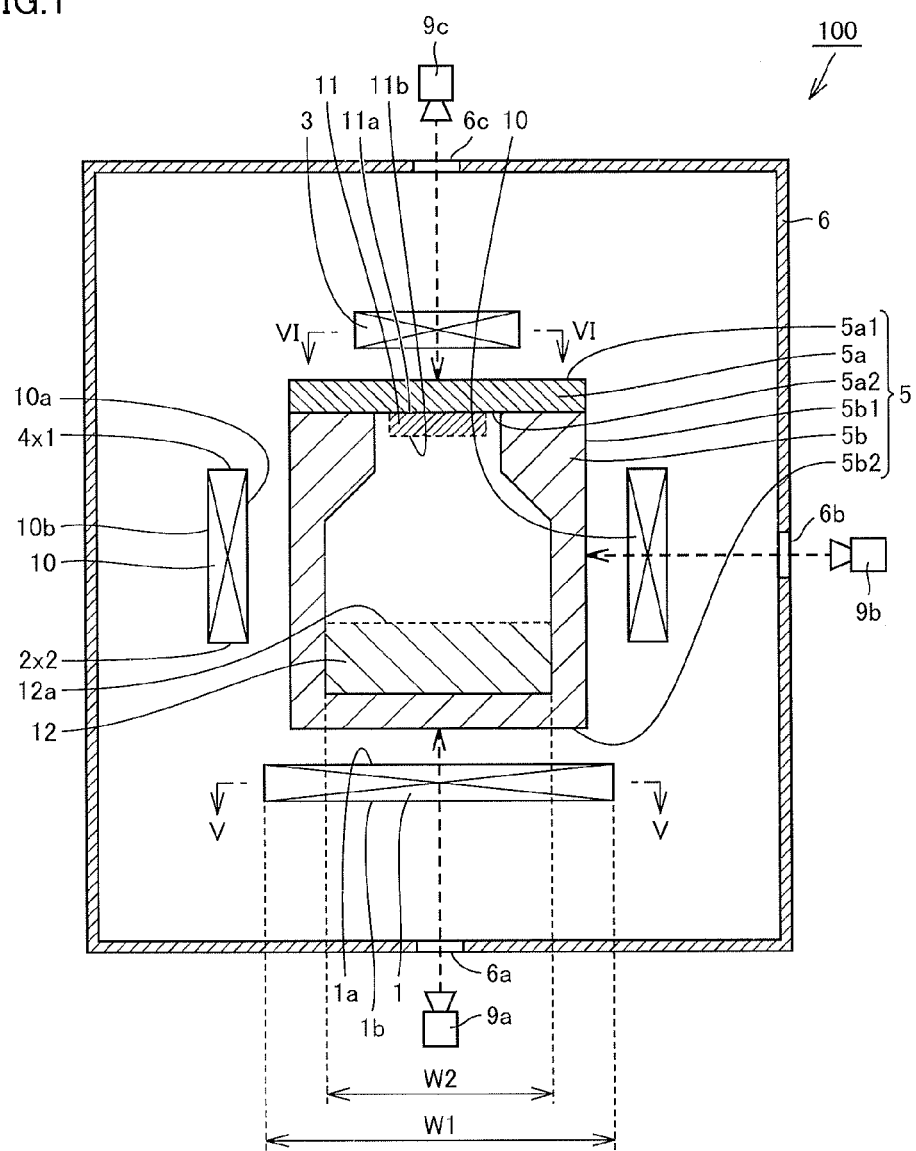
FIG. 1 is a schematic vertical sectional view showing the configuration of an apparatus of manufacturing a silicon carbide single crystal according to an embodiment.

When growing a silicon carbide single crystal by sublimation, a silicon carbide source material is sublimated with a resistive heater to generate silicon carbide gas, for example, and the silicon carbide gas is recrystallized on a seed crystal. In the step of growing a silicon carbide single crystal, the resistive heater has a temperature of about 2000° C. or more and 2400° C. or less, for example, and a chamber in which the resistive heater is placed has a pressure of about 1 kPa, for example. Under such a high-temperature, low-pressure environment, carbon forming the resistive heater is readily sublimated, resulting in degradation of the resistive heater.

(1) A method of manufacturing a silicon carbide single crystal according to the present disclosure includes the following steps. A crucible having a top surface, a bottom surface opposite to the top surface, and a tubular side surface located between the top surface and the bottom surface, a resistive heater provided outside of the crucible and made of carbon, a source material provided in the crucible, and a seed crystal provided to face the source material in the crucible are prepared. A silicon carbide single crystal is grown on the seed crystal by sublimating the source material with the resistive heater. In the step of growing a silicon carbide single crystal, a value obtained by dividing a value of a current flowing through the resistive heater by a cross-sectional area of the resistive heater perpendicular to a direction in which the current flows is maintained at 5 A/mm$^2$ or less. Consequently, degradation of the resistive heater can be suppressed.

(2) In the method of manufacturing a silicon carbide single crystal according to (1) above, in the step of growing a silicon carbide single crystal, a temperature of the resistive heater may be maintained at 2000° C. or more and 2400° C. or less.

(3) The method of manufacturing a silicon carbide single crystal according to (1) above may further include a step of preparing a chamber that accommodates the crucible. In the step of growing a silicon carbide single crystal, a pressure in the chamber may be maintained at 0.5 kPa or more and 2 kPa or less.

(4) The method of manufacturing a silicon carbide single crystal according to (1) above may further include a step of preparing a chamber that accommodates the crucible. The resistive heater may include a first resistive heater provided to face the bottom surface in the chamber, a second resistive heater arranged to surround the side surface in the chamber, and a third resistive heater provided to face the top surface in the chamber. In the step of growing a silicon carbide single crystal, a temperature of the first resistive heater may be 2000° C. or more and 2400° C. or less, a value obtained by dividing a value of a first current flowing through the first resistive heater by a first cross-sectional area of the first resistive heater perpendicular to a direction in which the first current flows may be maintained at 5 A/mm$^2$ or less, a temperature of the second resistive heater may be 2000° C. or more and 2400° C. or less, a value obtained by dividing a value of a second current flowing through the second resistive heater by a second cross-sectional area of the second resistive heater perpendicular to a direction in which the second current flows may be maintained at 5 A/mm$^2$ or less, a temperature of the third resistive heater may be 2000° C. or more and 2400° C. or less, a value obtained by dividing a value of a third current flowing through the third resistive heater by a third cross-sectional area of the third resistive heater perpendicular to a direction in which the third current flows may be maintained at 5 A/mm$^2$ or less, and a pressure in the chamber may be maintained at 0.5 kPa or more and 2 kPa or less.

(5) In the method of manufacturing a silicon carbide single crystal according to (1) above, the resistive heater may be arranged to surround the side surface. In the step of growing a silicon carbide single crystal, a difference between a maximum temperature and a minimum temperature of the resistive heater may be maintained at 100° C. or less. Consequently, the crystalline quality of the silicon carbide single crystal can be improved.

(6) In the method of manufacturing a silicon carbide single crystal according to (5) above, in the step of growing a silicon carbide single crystal, an average temperature of the resistive heater may be maintained at 2000° C. or more and 2400° C. or less.

(7) The method of manufacturing a silicon carbide single crystal according to (5) above may further include a step of preparing a chamber that accommodates the crucible. In the step of growing a silicon carbide single crystal, a pressure in the chamber may be maintained at 0.5 kPa or more and 2 kPa or less.

(8) The method of manufacturing a silicon carbide single crystal according to (5) above may further include a step of preparing a chamber that accommodates the crucible. In the step of growing a silicon carbide single crystal, an average temperature of the resistive heater may be 2000° C. or more and 2400° C. or less, the difference between the maximum temperature and the minimum temperature of the resistive heater may be maintained at 100° C. or less, and a pressure in the chamber may be maintained at 0.5 kPa or more and 2 kPa or less.

In a resistive heater described in Japanese National Patent Publication No. 2012-510951, a portion facing a side surface of the crucible and a portion facing a bottom surface of the crucible are formed as one piece. In order to control a temperature in the crucible more strictly, however, it may be possible to divide the resistive heater into a first resistive heater facing the bottom surface of the crucible and a second resistive heater facing the side surface of the crucible, and control electric power supplied to the resistive heaters independently of each other.

Figure 27:
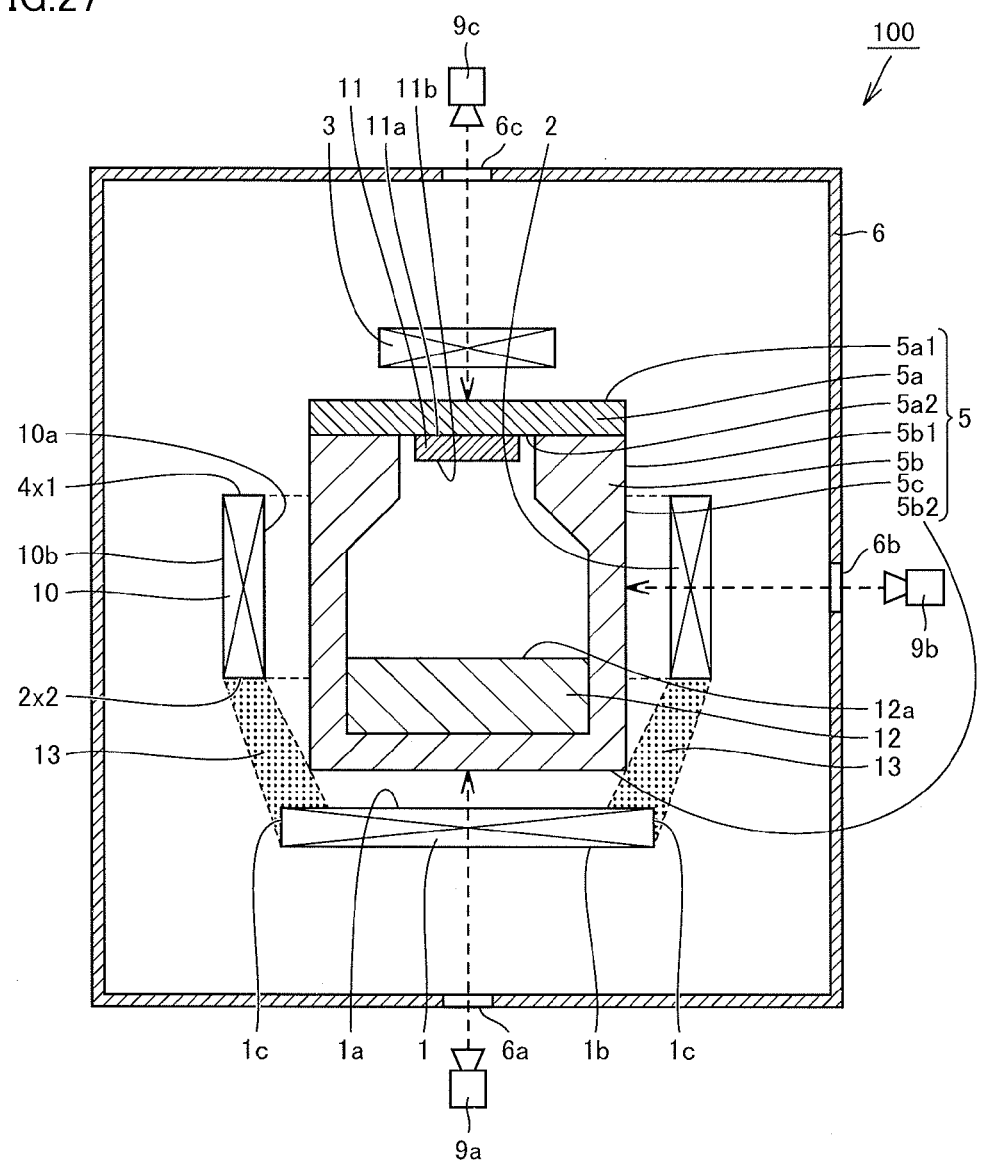
FIG. 27 is a schematic vertical sectional view showing a method of manufacturing a silicon carbide single crystal according to Group 2.

For example, it is assumed, as shown in FIG. 27, that a second resistive heater 10 is provided around a side surface 5b1 of a crucible 5, and a first resistive heater 1 is provided distant from second resistive heater 10 and so as to face a bottom surface 5b2 of crucible 5. A temperature of side surface 5b1 can be measured by a lateral radiation thermometer 9b provided outside of a chamber 6. Electric power supplied to second resistive heater 10 is feedback controlled, based on the temperature of side surface 5b1 measured by lateral radiation thermometer 9b, in such a manner as to keep the temperature of side surface 5b1 constant. When the temperature of side surface 5b1 is lower than a desired temperature, for example, the power supplied to second resistive heater 10 is increased to enhance the heating of side surface 5b1. In contrast, when the temperature of side surface 5b1 is higher than the desired temperature, the power supplied to second resistive heater 10 is reduced to decrease the heating of side surface 5b1. Likewise, a temperature of bottom surface 5b2 can be measured by a lower radiation thermometer 9a provided outside of chamber 6. Electric power supplied to first resistive heater 1 is feedback controlled, based on the temperature of bottom surface 5b2 measured by lower radiation thermometer 9a, in such a manner as to keep the temperature of bottom surface 5b2 constant.

As shown in FIG. 27, for example, when the power supplied to first resistive heater 1 is increased, second resistive heater 10 is heated by radiant light 13 from first resistive heater 1, causing an increase in temperature of second resistive heater 10. As the temperature of second resistive heater 10 increases, the temperature of side surface 5b1 of crucible 5 increases. As the temperature of side surface 5b1 increases, the power supplied to second resistive heater 10 is reduced so as to keep the temperature of side surface 5b1 constant. That is, when the power supplied to first resistive heater 1 is increased, the power supplied to second resistive heater 10 is reduced. In contrast, when the power supplied to second resistive heater 10 is increased, the power supplied to first resistive heater 1 is reduced. That is, first resistive heater 1 and second resistive heater 10 interfere with each other.

Figure 28:
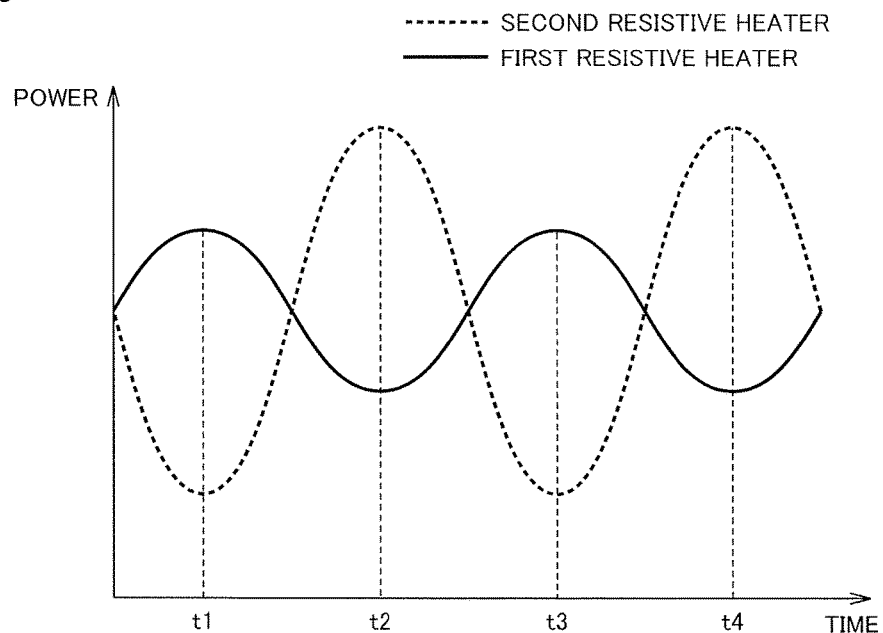
FIG. 28 is a diagram showing relation between electric power supplied to resistive heaters and time in the method of manufacturing a silicon carbide single crystal according to Group 2.

FIG. 28 is a diagram showing relation between electric power supplied to the resistive heaters and time in a step of growing a silicon carbide single crystal using an apparatus 100 of manufacturing a silicon carbide single crystal shown in FIG. 27. A vertical axis in FIG. 28 represents electric power supplied to the resistive heaters, and a horizontal axis represents time. As shown in FIG. 28, when the power supplied to first resistive heater 1 is increased, second resistive heater 10 is influenced by first resistive heater 1, causing a reduction in the power supplied to second resistive heater 10 (time t1 and time t3). In contrast, when the power supplied to second resistive heater 10 is increased, first resistive heater 1 is influenced by second resistive heater 10, causing a reduction in the power supplied to first resistive heater 1 (time t2 and time t4). That is, as shown in FIG. 28, second resistive heater 10 and first resistive heater 1 interfere with each other, causing a cyclic variation in each of the power supplied to second resistive heater 10 and the power supplied to first resistive heater 1. A cycle of temporal variation in power to second resistive heater 10 is substantially the same as a cycle of temporal variation in power to first resistive heater 1. A phase of the temporal variation in power to second resistive heater 10 is shifted by substantially a half cycle from a phase of the temporal variation in power to first resistive heater 1.

Figure 29:
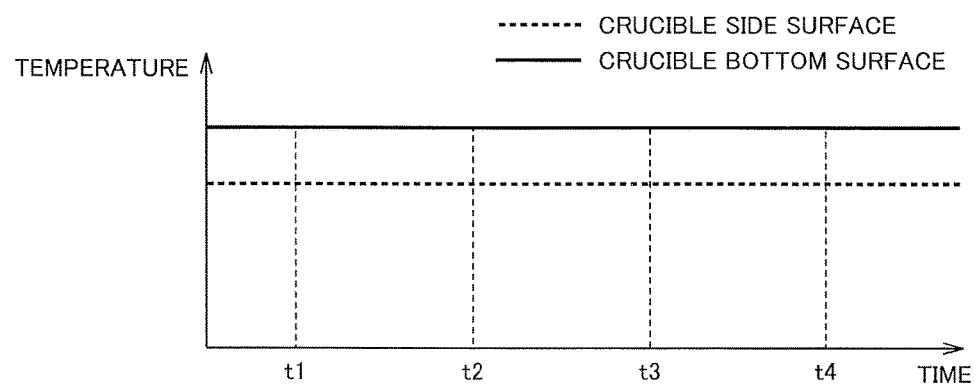
FIG. 29 is a diagram showing relation between temperature of a crucible and time in the method of manufacturing a silicon carbide single crystal according to Group 2.

FIG. 29 is a diagram showing relation between temperature of the crucible and time in the step of growing a silicon carbide single crystal using apparatus 100 of manufacturing a silicon carbide single crystal shown in FIG. 27. A vertical axis in FIG. 29 represents a temperature of the crucible, and a horizontal axis represents time. As shown in FIG. 29, temperatures of temperature-measured portions of bottom surface 5b2 and side surface 5b1 of crucible 5 are constant. However, since the power supplied to first resistive heater 1 varies significantly with time as shown in FIG. 28, it is believed that a temperature of a portion of bottom surface 5b2 other than the temperature-measured portion varies significantly with time. Likewise, since the power supplied to second resistive heater 10 varies significantly with time, it is believed that a temperature of a portion of side surface 5b1 other than the temperature-measured portion varies significantly with time.

Figure 23:
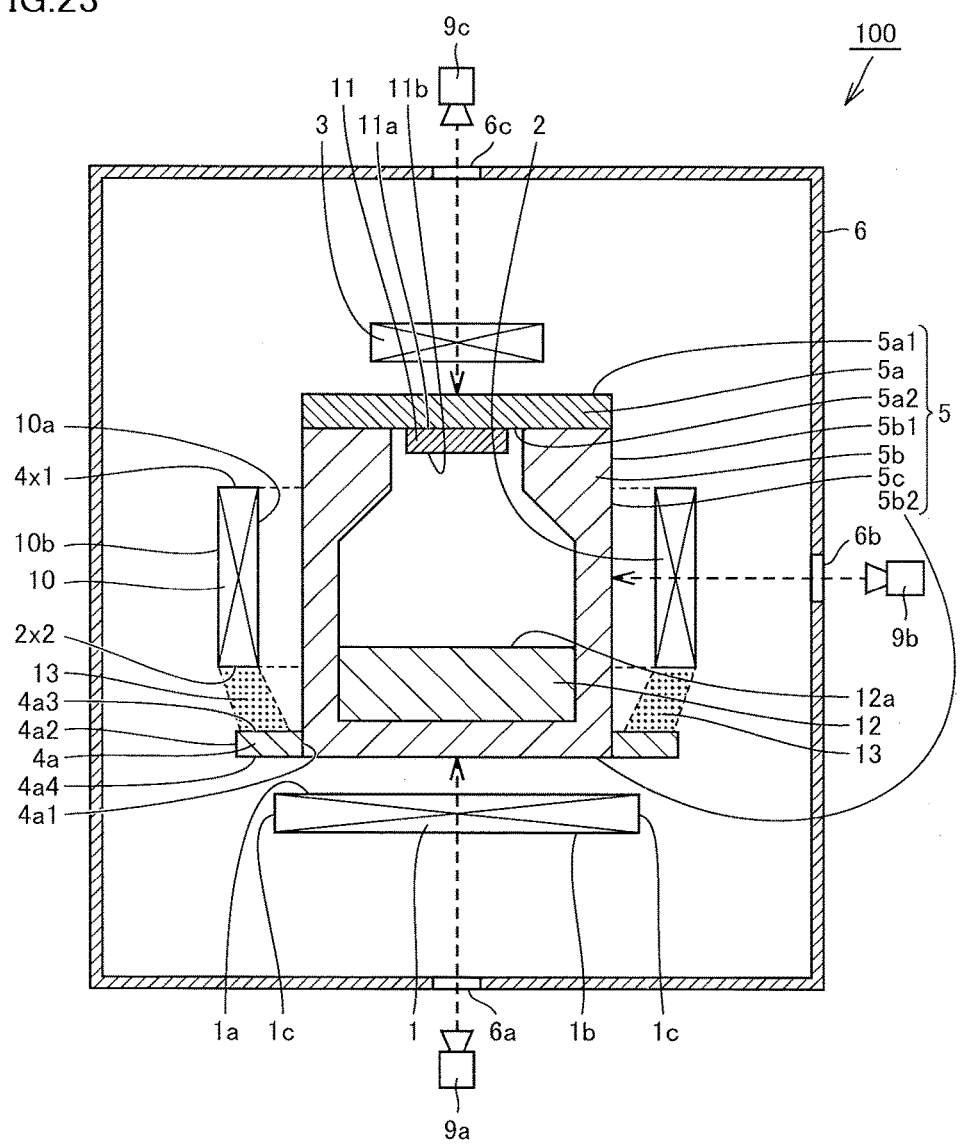
FIG. 23 is a schematic vertical sectional view showing a variation of the first step of the method of manufacturing a silicon carbide single crystal according to the embodiment.

Accordingly, the present inventors conceived of providing, as shown in FIG. 23, a partition unit 4a so as to at least partially prevent radiant light 13 from second resistive heater 10 from reaching first resistive heater 1. Crystal growth of a silicon carbide single crystal is performed at a pressure of about 1 kPa, for example, and therefore, thermal conduction between first resistive heater 1 and second resistive heater 10 takes place mainly by radiation. Thus, by providing partition unit 4a so as to at least partially block radiant light 13 from second resistive heater 10, heat transfer from first resistive heater 1 to second resistive heater 10 can be significantly suppressed. Likewise, heat transfer from second resistive heater 10 to first resistive heater 1 can be significantly suppressed by partition unit 4a.

Figure 25:
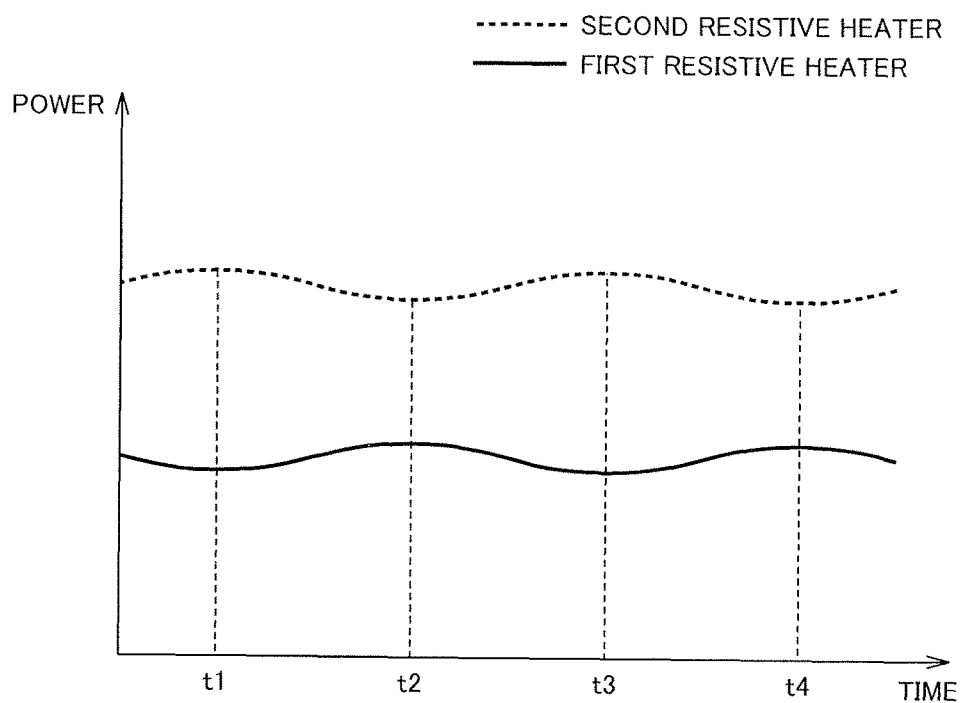
FIG. 25 is a diagram showing relation between electric power supplied to resistive heaters and time in a method of manufacturing a silicon carbide single crystal according to Group 1.
Figure 26:
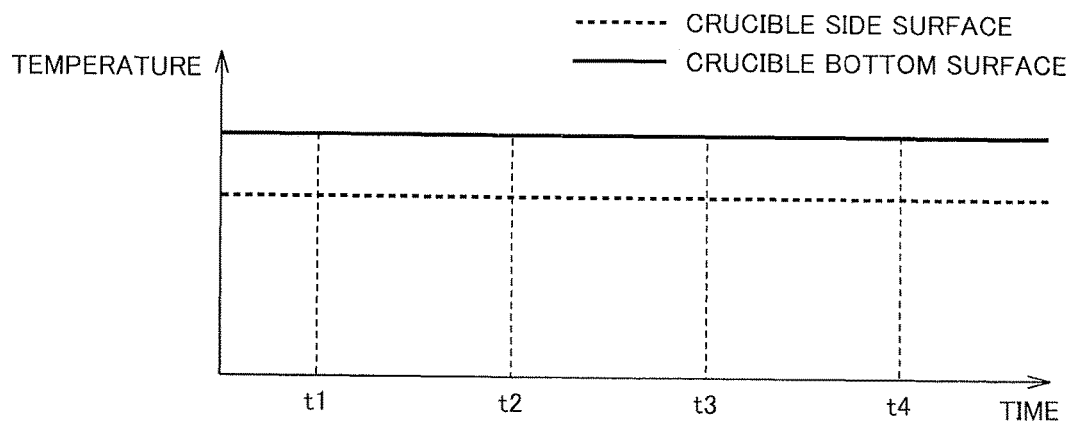
FIG. 26 is a diagram showing relation between temperature of a crucible and time in the method of manufacturing a silicon carbide single crystal according to Group 1.

FIG. 25 is a diagram showing relation between electric power supplied to the resistive heaters and time in a step of growing a silicon carbide single crystal using apparatus 100 of manufacturing a silicon carbide single crystal shown in FIG. 23. A vertical axis in FIG. 25 represents electric power supplied to the resistive heaters, and a horizontal axis represents time. FIG. 26 is a diagram showing relation between temperature of the crucible and time in the step of growing a silicon carbide single crystal using apparatus 100 of manufacturing a silicon carbide single crystal shown in FIG. 23. A vertical axis in FIG. 26 represents a temperature of the crucible, and a horizontal axis represents time. In the apparatus of manufacturing a silicon carbide single crystal shown in FIG. 23, partition unit 4a is provided so as to at least partially prevent radiant light 13 from second resistive heater 10 from reaching first resistive heater 1.

As shown in FIG. 26, temperatures of temperature-measured portions of bottom surface 5b2 and side surface 5b1 of crucible 5 are constant. As shown in FIG. 25, a width of variation in power supplied to each of first resistive heater 1 and second resistive heater 10 with the use of the apparatus of manufacturing a silicon carbide single crystal provided with partition unit 4a is significantly reduced from a width of variation in power supplied to each of first resistive heater 1 and second resistive heater 10 with the use of the apparatus of manufacturing a silicon carbide single crystal not provided with partition unit 4a (see FIG. 28). Thus, it is believed that temporal variation in temperature of a portion of crucible 5 other than the temperature-measured portion is significantly reduced when the apparatus of manufacturing a silicon carbide single crystal provided with partition unit 4a is used to grow a silicon carbide single crystal, as compared with when the apparatus of manufacturing a silicon carbide single crystal not provided with partition unit 4a is used to grow a silicon carbide single crystal. As a result, it is believed that temporal variation in temperature of the entire crucible 5 can be suppressed.

(9) In the method of manufacturing a silicon carbide single crystal according to (1) above, the resistive heater may include a first resistive heater provided to face the bottom surface, and a second resistive heater arranged to surround the side surface. A partition unit located outside of a portion of the side surface facing the second resistive heater may be prepared. In the step of growing a silicon carbide single crystal, with the partition unit provided so as to at least partially prevent radiant light from the second resistive heater from reaching the first resistive heater, electric power supplied to the first resistive heater may be determined based on a temperature of at least one of the bottom surface and the first resistive heater, and electric power supplied to the second resistive heater may be determined based on a temperature of at least one of the side surface and the second resistive heater. Consequently, temporal variation in temperature of the crucible can be suppressed.

2. Details of Embodiments

Embodiments will be described below with reference to the drawings. In the following drawings, the same or corresponding parts are designated by the same reference numbers and description thereof will not be repeated. Regarding crystallographic denotation herein, an individual orientation, a group orientation, an individual plane, and a group plane are shown in [ ], < >, ( ), and { }, respectively. Although a crystallographically negative index is normally expressed by a number with a bar "–" thereabove, a negative sign herein precedes a number to indicate a crystallographically negative index.

[2-1. Apparatus of Manufacturing Silicon Carbide Single Crystal]

The configuration of an apparatus 100 of manufacturing a silicon carbide single crystal according to the present disclosure is described.

As shown in FIG. 1, apparatus 100 of manufacturing a silicon carbide single crystal according to the present embodiment is an apparatus for manufacturing a silicon carbide single crystal by sublimation, and mainly includes a crucible 5, a resistive heater, a chamber 6, a lower radiation thermometer 9a, a lateral radiation thermometer 9b, and an upper radiation thermometer 9c. The resistive heater includes a first resistive heater 1, a second resistive heater 10, and a third resistive heater 3. A heat insulator may be provided between each of first resistive heater 1, second resistive heater 10 and third resistive heater 3, and chamber 6. Crucible 5 has a top surface 5a1, a bottom surface 5b2 opposite to top surface 5a1, and a tubular side surface 5b1 located between top surface 5a1 and bottom surface 5b2. Side surface 5b1 has a cylindrical shape, for example. Crucible 5 has a pedestal 5a configured to be able to hold a seed crystal 11, and an accommodation unit 5b configured to be able to accommodate a silicon carbide source material 12. Pedestal 5a has a seed crystal holding surface 5a2 in contact with a backside surface 11a of seed crystal 11, and top surface 5a1 opposite to seed crystal holding surface 5a2. Pedestal 5a forms top surface 5a1. Accommodation unit 5b forms bottom surface 5b2. Side surface 5b1 is formed of pedestal 5a and accommodation unit 5b. In crucible 5, a silicon carbide single crystal is grown on a surface 11b of seed crystal 11 by sublimation of silicon carbide source material 12 and recrystallization of the source material on surface 11b of seed crystal 11. That is, a silicon carbide single crystal can be manufactured by sublimation.

Each of first resistive heater 1, second resistive heater 10 and third resistive heater 3 is provided outside of crucible 5. First resistive heater 1 is provided to face bottom surface 5b2 of crucible 5. First resistive heater 1 is distant from bottom surface 5b2. First resistive heater 1 has an upper surface 1a facing bottom surface 5b2, and a lower surface 1b opposite to upper surface 1a. Second resistive heater 10 is arranged to surround side surface 5b1. Second resistive heater 10 is distant from side surface 5b1. The second resistive heater includes, in a direction from top surface 5a1 toward bottom surface 5b2, a tenth surface 4x1 located toward top surface 5a1, a sixth surface 2x2 located toward bottom surface 5b2, an inner circumferential surface 10a facing side surface 5b1, and an outer circumferential surface 10b opposite to inner circumferential surface 10a. Preferably, sixth surface 2x2 of second resistive heater 10 is located between bottom surface 5b2 and top surface 5a1 in the direction from top surface 5a1 toward bottom surface 5b2. Third resistive heater 3 is provided to face top surface 5a1. Third resistive heater 3 is distant from top surface 5a1.

Lower radiation thermometer 9a is provided outside of chamber 6 in a position facing bottom surface 5b2 of crucible 5, and configured to be able to measure a temperature of bottom surface 5b2 through a window 6a. Lower radiation thermometer 9a is provided in a position facing first resistive heater 1, and may be configured to be able to measure a temperature of first resistive heater 1. Lateral radiation thermometer 9b is provided outside of chamber 6 in a position facing side surface 5b1, and configured to be able to measure a temperature of side surface 5b1 through a window 6b. Lateral radiation thermometer 9b is provided in a position facing second resistive heater 10, and may be configured to be able to measure a temperature of second resistive heater 10. Upper radiation thermometer 9c is provided outside of chamber 6 in a position facing top surface 5a1, and configured to be able to measure a temperature of top surface 5a1 through a window 6c. Upper radiation thermometer 9c is provided in a position facing third resistive heater 3, and may be configured to be able to measure a temperature of third resistive heater 3.

A pyrometer manufactured by CHINO Corporation (model number: IR-CAH8TN6) can be used, for example, as radiation thermometers 9a, 9b and 9c. The pyrometer has measurement wavelengths of 1.55 μm and 0.9 μm, for example. The pyrometer has a set value for emissivity of 0.9, for example. The pyrometer has a distance coefficient of 300, for example. A measurement diameter of the pyrometer is determined by dividing a measurement distance by the distance coefficient. If the measurement distance is 900 mm, for example, the measurement diameter is 3 mm.

Figure 2:
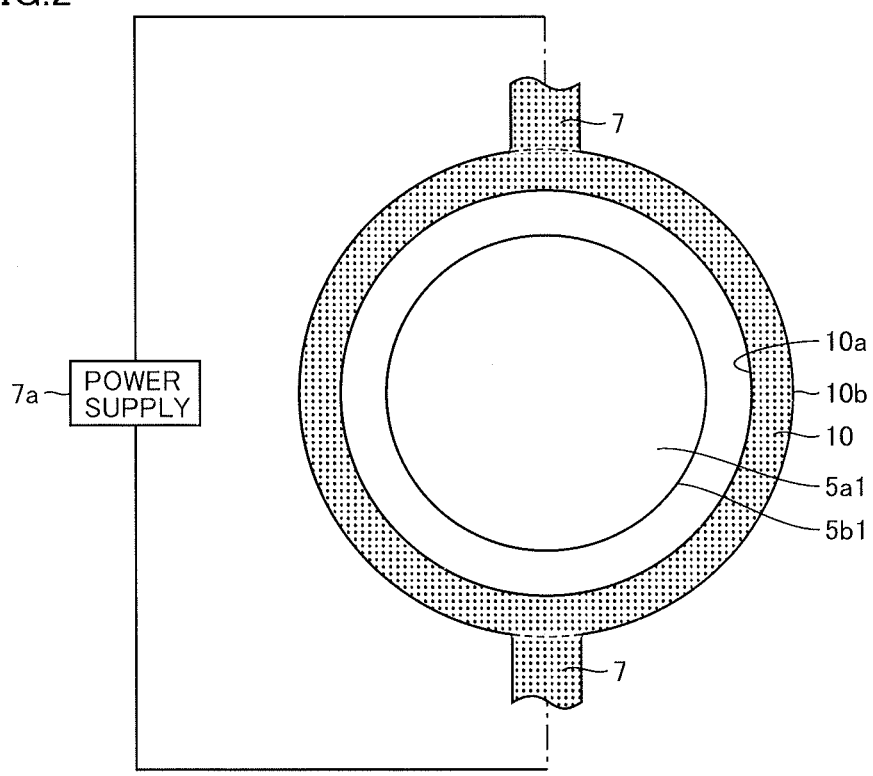
FIG. 2 is a schematic plan view showing the configuration of a second resistive heater and electrodes.

When viewed along the direction from top surface 5a1 toward bottom surface 5b2, as shown in FIG. 2, second resistive heater 10 is provided to surround side surface 5b1 and has a ring shape. A pair of electrodes 7 is provided in contact with outer circumferential surface 10b of second resistive heater 10. When viewed along a direction perpendicular to top surface 5a1, the pair of electrodes 7 and top surface 5a1 may be aligned with each other. The pair of electrodes 7 is connected to a second power supply 7a. Second power supply 7a is configured to be able to supply electric power to second resistive heater 10. Preferably, second resistive heater 10 forms a parallel circuit.

Figure 3:
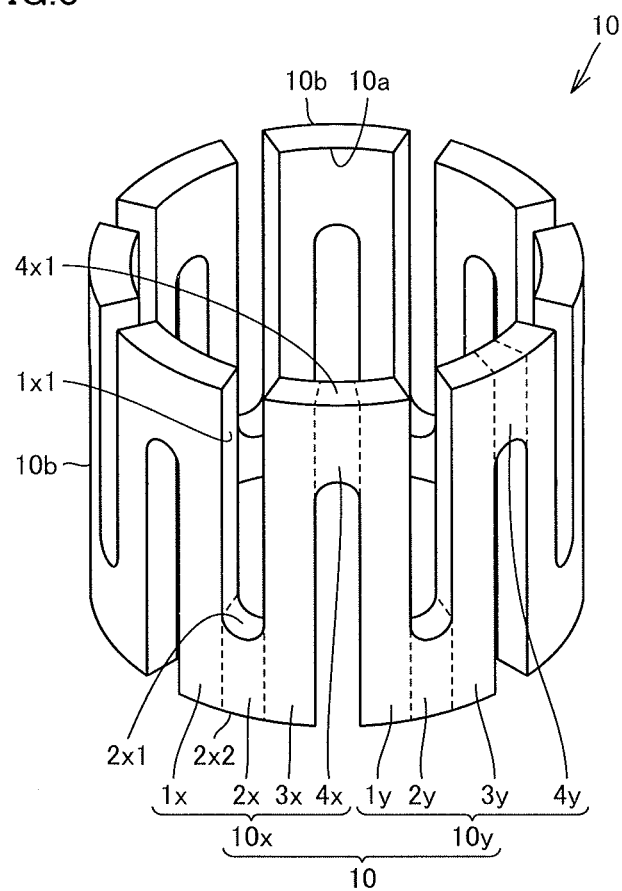
FIG. 3 is a schematic perspective view showing the configuration of the second resistive heater.
Figure 4:
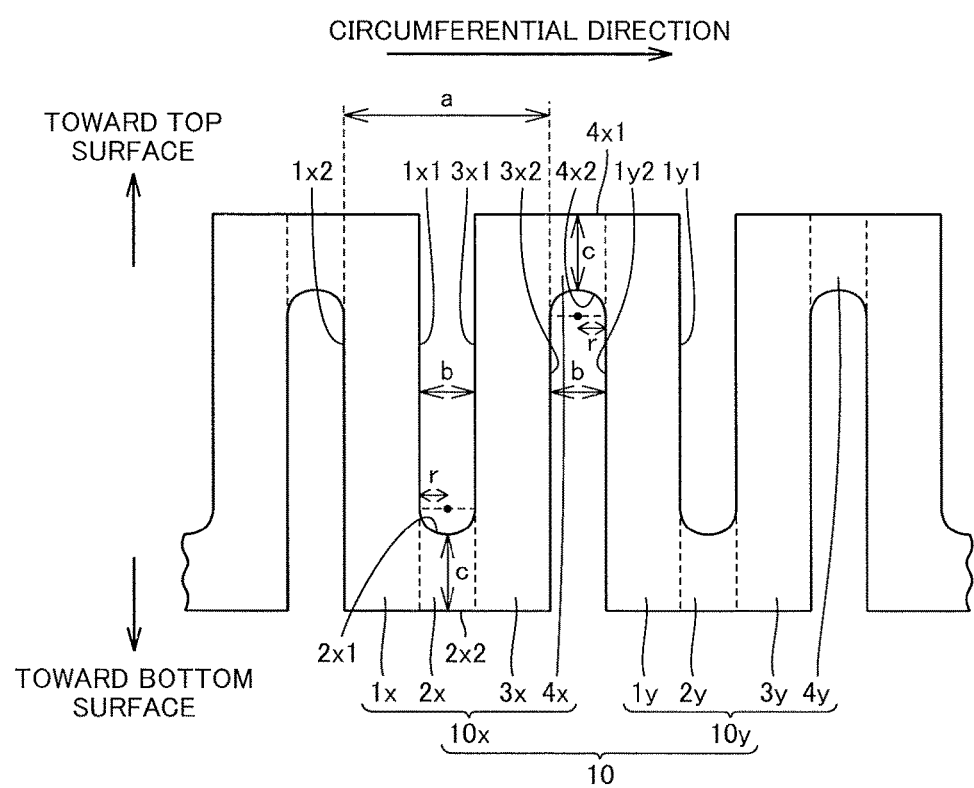
FIG. 4 is a schematic side view showing the configuration of the second resistive heater along a circumferential direction.

As shown in FIGS. 1, 3 and 4, second resistive heater 10 has a first portion 1x extending along the direction from top surface 5a1 toward bottom surface 5b2, a second portion 2x provided continuously with first portion 1x on the side close to bottom surface 5b2 and extending along a circumferential direction of side surface 5b1, a third portion 3x provided continuously with second portion 2x and extending along a direction from bottom surface 5b2 toward top surface 5a1, and a fourth portion 4x provided continuously with third portion 3x on the side close to top surface 5a1 and extending along the circumferential direction of side surface 5b1. First portion 1x, second portion 2x, third portion 3x and fourth portion 4x form a heater unit 10x.

Likewise, second resistive heater 10 has a fifth portion 1y provided continuously with fourth portion 4x on the side close to top surface 5a1 and extending along the direction from top surface 5a1 toward bottom surface 5b2, a sixth portion 2y provided continuously with fifth portion 1y on the side close to bottom surface 5b2 and extending along the circumferential direction of side surface 5b1, a seventh portion 3y provided continuously with sixth portion 2y and extending along the direction from bottom surface 5b2 toward top surface 5a1, and an eighth portion 4y provided continuously with seventh portion 3y on the side close to top surface 5a1 and extending along the circumferential direction of side surface 5b1. Fifth portion 1y, sixth portion 2y, seventh portion 3y and eighth portion 4y form a heater unit 10y. Second resistive heater 10 is formed in an annular shape of a plurality of continuously provided heater units 10x and 10y.

First portion 1x of second resistive heater 10 has a first surface 1x1 facing third portion 3x, and a second surface 1x2 opposite to first surface 1x1. Third portion 3x has a third surface 3x1 facing first surface 1x1, and a fourth surface 3x2 opposite to third surface 3x1. Second portion 2x has a fifth surface 2x1 located between first surface 1x1 and third surface 3x1, and sixth surface 2x2 opposite to fifth surface 2x1. Fifth surface 2x1 is provided so as to connect first surface 1x1 with third surface 3x1. Assuming that a distance between second surface 1x2 and fourth surface 3x2 in the circumferential direction is a, a distance between first surface 1x1 and third surface 3x1 in the circumferential direction is b, the shortest distance between fifth surface 2x1 and sixth surface 2x2 in the direction from top surface 5a1 toward bottom surface 5b2 is c, and a radius of curvature of fifth surface 2x1 when viewed along a direction perpendicular to side surface 5b1 is r, it is preferable that a≥3b, c≥b, and r≥b/2 be satisfied. Distance a is 50 mm or more and 60 mm or less, for example. Distance b is 10 mm or more and 15 mm or less, for example. Shortest distance c is 15 mm or more and 25 mm or less, for example. Radius of curvature r is 5 mm or more and 10 mm or less, for example.

Fifth portion 1y of second resistive heater 10 has a seventh surface 1y2 facing third portion 3x, and an eighth surface 1y1 opposite to seventh surface 1y2. Fourth portion 4x has a ninth surface 4x2 located between fourth surface 3x2 and seventh surface 1y2, and tenth surface 4x1 opposite to ninth surface 4x2. Ninth surface 4x2 is provided so as to connect fourth surface 3x2 with seventh surface 1y2. The distance between second surface 1x2 and fourth surface 3x2 in the circumferential direction is substantially equal to the distance between third surface 3x1 and eighth surface 1y1 in the circumferential direction. The distance between first surface 1x1 and third surface 3x1 in the circumferential direction is substantially equal to the distance between fourth surface 3x2 and seventh surface 1y2 in the circumferential direction. The shortest distance between fifth surface 2x1 and sixth surface 2x2 in the direction from top surface 5a1 toward bottom surface 5b2 is substantially equal to the shortest distance between ninth surface 4x2 and tenth surface 4x1 in the direction from top surface 5a1 toward bottom surface 5b2. The radius of curvature of fifth surface 2x1 when viewed along the direction perpendicular to side surface 5b1 is substantially equal to the radius of curvature of ninth surface 4x2 when viewed along the direction perpendicular to side surface 5b1.

Each of fifth surface 2x1 and ninth surface 4x2 is a curved surface. When viewed along the direction perpendicular to side surface 5b1, each of fifth surface 2x1 and ninth surface 4x2 is a semicircle, for example. The distance between fifth surface 2x1 and sixth surface 2x2 in the direction from top surface 5a1 toward bottom surface 5b2 is at a minimum near a portion intermediate between first portion 1x and third portion 3x in the circumferential direction. Likewise, the distance between ninth surface 4x2 and tenth surface 4x1 in the direction from the top surface toward the bottom surface is at a minimum near a portion intermediate between third portion 3x and fifth portion 1y in the circumferential direction.

Second power supply 7a and second resistive heater 10 are configured such that, when the temperature of second resistive heater 10 reaches a temperature of 2000° C. or more and 2400° C. or less due to a supply of electric power to second resistive heater 10 from second power supply 7a, a value (second current density) obtained by dividing a value of a current (second current) flowing through second resistive heater 10 by a cross-sectional area (second cross-sectional area) of second resistive heater 10 perpendicular to a direction in which the second current flows is 1 A/mm$^2$ or more and 5 A/mm$^2$ or less. Preferably, the second current density is 4 A/mm$^2$ or less, and more preferably 3 A/mm$^2$ or less. Preferably, the second cross-sectional area is 100 mm$^2$ or more and 500 mm$^2$ or less. When the cross-sectional area of second resistive heater 10 varies along the direction in which the second current flows, a minimum value of the cross-sectional area of second resistive heater 10 is preferably 100 mm$^2$ or more and 500 mm$^2$ or less. When the cross-sectional area of second resistive heater 10 varies along the direction in which the second current flows, a maximum value of the current density of second resistive heater 10 is preferably 5 A/mm$^2$ or less.

Figure 5:
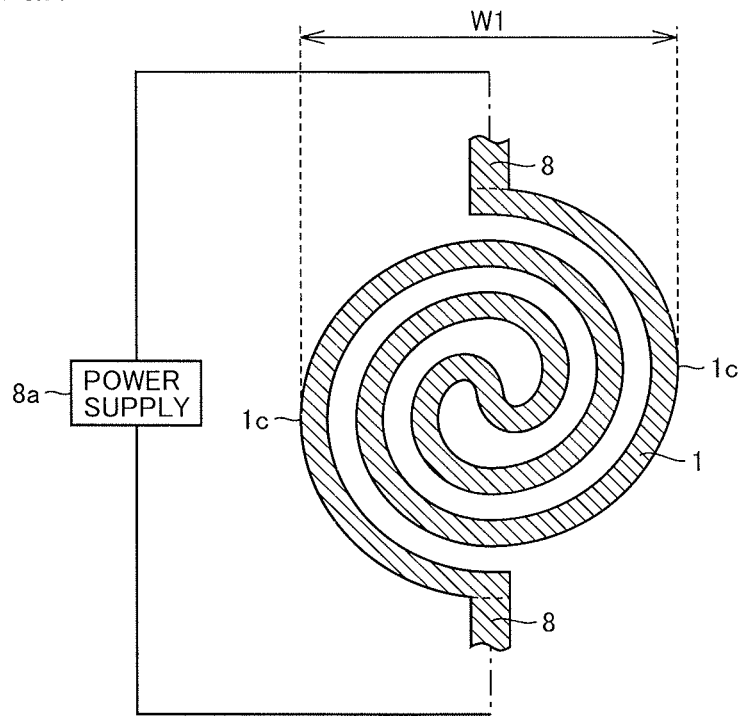
FIG. 5 is a schematic transverse sectional view taken along line V-V in a direction of arrows in FIG. 1, which shows the configuration of a first resistive heater and electrodes.

As shown in FIG. 5, when viewed along the direction from top surface 5a1 toward bottom surface 5b2, first resistive heater 1 has a shape made of two curves which move away from a center while whirling and meet each other at the center. Preferably, first resistive heater 1 has the shape of a Fermat's spiral. A pair of electrodes 8 is connected across first resistive heater 1. The pair of electrodes 8 is connected to a first power supply 8a. First power supply 8a is configured to be able to supply electric power to first resistive heater 1. When viewed along a direction parallel to bottom surface 5b2, a width W1 of first resistive heater 1 is greater than a width W2 of the interior of crucible 5 (see FIG. 1), and preferably greater than a width of bottom surface 5b2. Width W1 of first resistive heater 1 is measured exclusive of electrodes 8.

First power supply 8a and first resistive heater 1 are configured such that, when the temperature of first resistive heater 1 reaches a temperature of 2000° C. or more and 2400° C. or less due to a supply of electric power to first resistive heater 1 from first power supply 8a, a value (first current density) obtained by dividing a value of a current (first current) flowing through first resistive heater 1 by a cross-sectional area (first cross-sectional area) of first resistive heater 1 perpendicular to a direction in which the first current flows is 1 A/mm$^2$ or more and 5 A/mm$^2$ or less. Preferably, the first current density is 4 A/mm$^2$ or less, and more preferably 3 A/mm$^2$ or less. Preferably, the first cross-sectional area is 100 mm$^2$ or more and 500 mm$^2$ or less. When the cross-sectional area of first resistive heater 1 varies along the direction in which the first current flows, a minimum value of the cross-sectional area of first resistive heater 1 is preferably 100 mm$^2$ or more and 500 mm$^2$ or less. When the cross-sectional area of first resistive heater 1 varies along the direction in which the first current flows, a maximum value of the current density of first resistive heater 1 is preferably 5 A/mm$^2$ or less.

Figure 6:
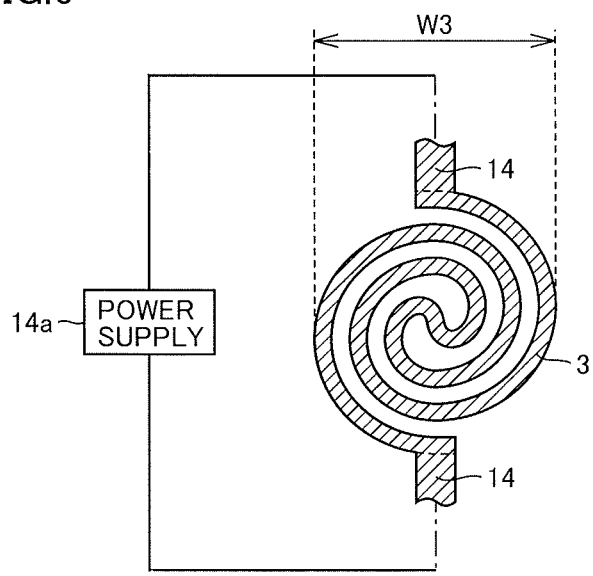
FIG. 6 is a schematic transverse sectional view taken along line VI-VI in a direction of arrows in FIG. 1, which shows the configuration of a third resistive heater and electrodes.

As shown in FIG. 6, when viewed along the direction from top surface 5a1 toward bottom surface 5b2, third resistive heater 3 has a shape made of two curves which move away from a center while whirling and meet each other at the center. Preferably, third resistive heater 3 has the shape of a Fermat's spiral. A pair of electrodes 14 is connected across third resistive heater 3. The pair of electrodes 14 is connected to a third power supply 14a. Third power supply 14a is configured to be able to supply electric power to third resistive heater 3. When viewed along a direction parallel to top surface 5a1, a width of third resistive heater 3 is smaller than a width of top surface 5a1. The width of third resistive heater 3 is measured exclusive of electrodes 14.

Third power supply 14a and third resistive heater 3 are configured such that, when the temperature of third resistive heater 3 reaches a temperature of 2000° C. or more and 2400° C. or less due to a supply of electric power to third resistive heater 3 from third power supply 14a, a value (third current density) obtained by dividing a value of a current (third current) flowing through third resistive heater 3 by a cross-sectional area (third cross-sectional area) of third resistive heater 3 perpendicular to a direction in which the third current flows is 1 A/mm$^2$ or more and 5 A/mm$^2$ or less. Preferably, the third current density is 4 A/mm$^2$ or less, and more preferably 3 A/mm$^2$ or less. Preferably, the third cross-sectional area is 100 mm$^2$ or more and 500 mm$^2$ or less. When the cross-sectional area of third resistive heater 3 varies along the direction in which the third current flows, a minimum value of the cross-sectional area of third resistive heater 3 is preferably 100 mm$^2$ or more and 500 mm$^2$ or less. When the cross-sectional area of third resistive heater 3 varies along the direction in which the third current flows, a maximum value of the current density of third resistive heater 3 is preferably 5 A/mm$^2$ or less.

Figure 9:
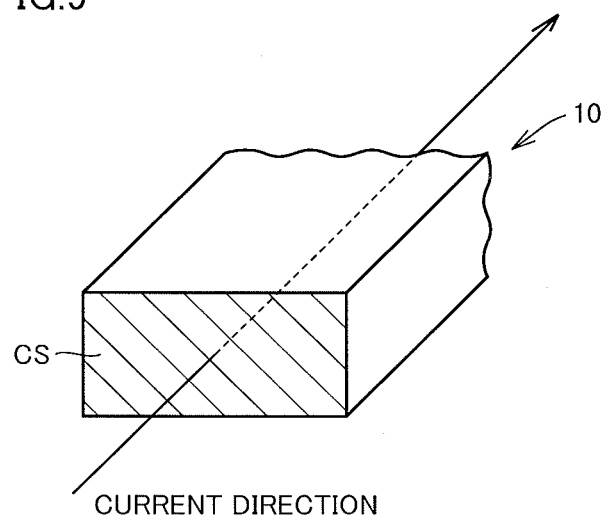
FIG. 9 is a schematic perspective view showing a cross section of the resistive heater perpendicular to a direction of a current flow.

As shown in FIG. 9, a cross section CS of second resistive heater 10 perpendicular to the direction of a current flow through second resistive heater 10 may have a rectangular shape. Cross section CS may have a polygonal, elliptical, or circular shape, or a shape with beveled corners of a rectangle.

Carbon forming each of first resistive heater 1, second resistive heater 10 and third resistive heater 3 has a density of 1.6 g/cm$^3$ or more and 2.0 g/cm$^3$ or less, for example, and preferably 1.7 g/cm$^3$ or more and 1.9 g/cm$^3$ or less. The carbon forming each of first resistive heater 1, second resistive heater 10 and third resistive heater 3 has a resistivity of 1100 mΩ·cm or more and 1800 mΩ·cm or less, for example, and preferably 1200 mΩ·cm or more and 1700 Ω·cm or less.

It is noted that each of crucible 5, the heat insulator, first resistive heater 1, second resistive heater 10 and third resistive heater 3 is made of carbon, for example, and preferably made of graphite. The carbon (graphite) may contain an impurity which is incorporated therein during manufacturing. Each of electrodes 7, 8 and 14 may be made of carbon (preferably graphite), for example, or may be made of metal such as copper.

[2-2. Method of Manufacturing Silicon Carbide Single Crystal]

Next, a method of manufacturing a silicon carbide single crystal according to the present disclosure is described.

Figure 7:
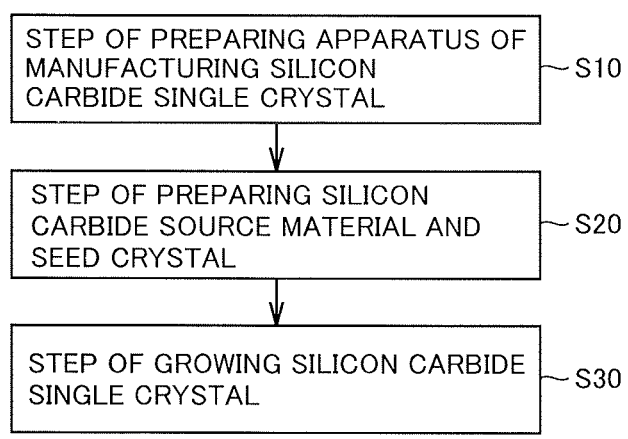
FIG. 7 is a flowchart showing a method of manufacturing a silicon carbide single crystal according to the embodiment.

First, a step of preparing an apparatus of manufacturing a silicon carbide single crystal (S10: FIG. 7) is performed. For example, apparatus 100 of manufacturing a silicon carbide single crystal described above is prepared (see FIG. 1). Apparatus 100 of manufacturing a silicon carbide single crystal mainly includes chamber 6, crucible 5, first resistive heater 1, second resistive heater 10, and third resistive heater 3. Crucible 5 is provided in chamber 6, and has top surface 5a1, bottom surface 5b2 opposite to top surface 5a1, and tubular side surface 5b1 located between top surface 5a1 and bottom surface 5b2. First resistive heater 1 is provided to face bottom surface 5b2 in chamber 6, and made of carbon. Second resistive heater 10 is arranged to surround side surface 5b1 in chamber 6, and made of carbon. Third resistive heater 3 is provided to face top surface 5a1 in chamber 6, and made of carbon. Each of first resistive heater 1, second resistive heater 10 and third resistive heater 3 is provided outside of crucible 5. Chamber 6 accommodates crucible 5, first resistive heater 1, second resistive heater 10, and third resistive heater 3.

Figure 8:
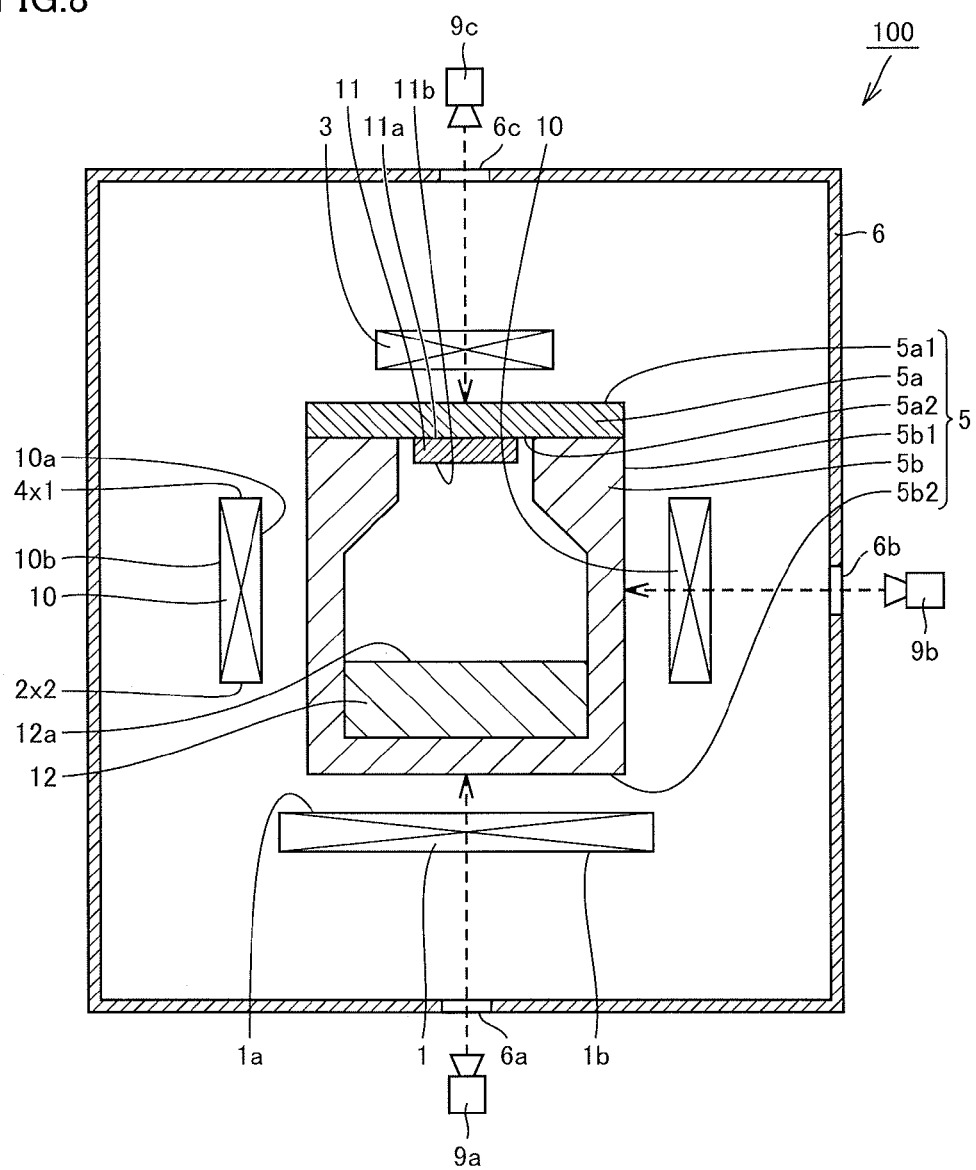
FIG. 8 is a schematic vertical sectional view showing a first step of the method of manufacturing a silicon carbide single crystal according to the embodiment.

Next, a step of preparing a silicon carbide source material and a seed crystal (S20: FIG. 7) is performed. Specifically, as shown in FIG. 8, seed crystal 11 and silicon carbide source material 12 are placed in crucible 5. Silicon carbide source material 12 is provided in accommodation unit 5b of crucible 5. Silicon carbide source material 12 is powders of polycrystalline silicon carbide, for example. Seed crystal 11 is fixed on seed crystal holding surface 5a2 of pedestal 5a with an adhesive, for example. Seed crystal 11 is a substrate of hexagonal silicon carbide having a polytype of 4H, for example. Seed crystal 11 has backside surface 11a fixed to seed crystal holding surface 5a2 of pedestal 5a, and surface 11b opposite to backside surface 11a. Surface 11b of seed crystal 11 has a diameter of 100 mm or more, for example, and preferably 150 mm or more. Surface 11b of seed crystal 11 is a plane having an off angle of about 8° or less relative to a {0001} plane, for example. Seed crystal 11 is disposed such that surface 11b of seed crystal 11 faces a surface 12a of silicon carbide source material 12. In this manner, silicon carbide source material 12 provided in crucible 5 and seed crystal 11 provided to face silicon carbide source material 12 in crucible 5 are prepared.

Figure 10:
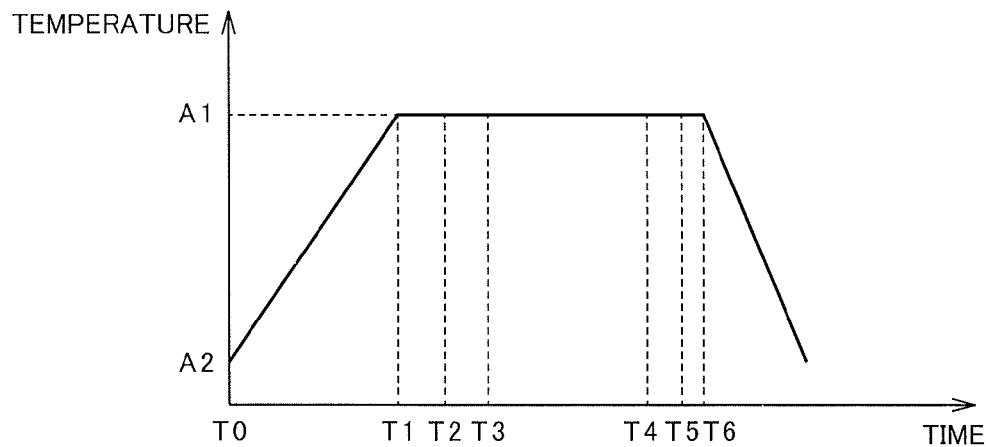
FIG. 10 is a diagram showing relation between temperature of a crucible and time.
Figure 11:
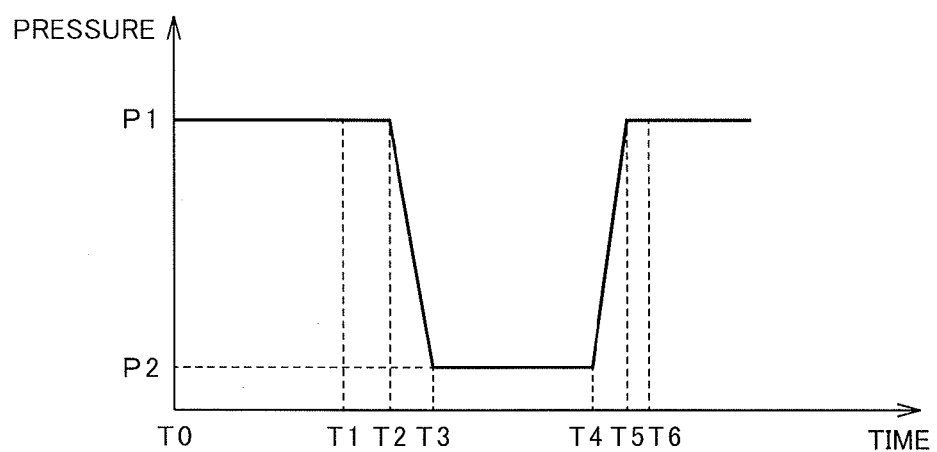
FIG. 11 is a diagram showing relation between pressure in a chamber and time.

Next, a step of growing a silicon carbide single crystal (S30: FIG. 7) is performed. Specifically, crucible 5 is heated with first resistive heater 1, second resistive heater 10 and third resistive heater 3. As shown in FIG. 10, crucible 5 having a temperature A2 at time T0 is heated to a temperature A1 at time T1. Temperature A2 is room temperature, for example. Temperature A1 is 2000° C. or more and 2400° C. or less, for example. Both silicon carbide source material 12 and seed crystal 11 are heated such that the temperature decreases from bottom surface 5b2 toward top surface 5a1. Crucible 5 is maintained at temperature A1 between time T1 and time T6. As shown in FIG. 11, a pressure P1 is maintained in chamber 6 between time T0 and time T2. Pressure P1 is atmospheric pressure, for example. An atmospheric gas in chamber 6 is inert gas such as argon gas, helium gas or nitrogen gas.

Figure 13:
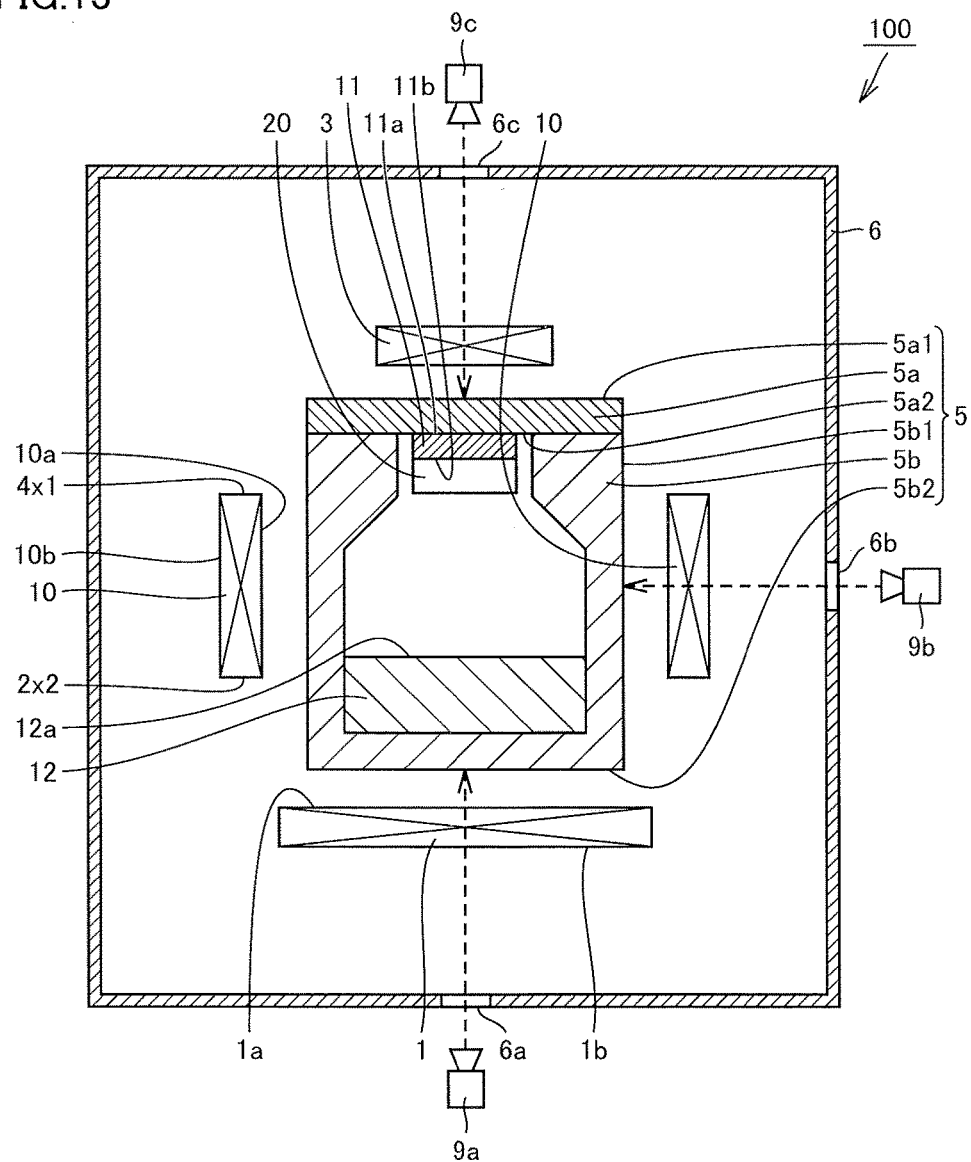
FIG. 13 is a schematic vertical sectional view showing a second step of the method of manufacturing a silicon carbide single crystal according to the embodiment.

At time T2, the pressure in chamber 6 is lowered from pressure P1 to a pressure P2. Pressure P2 is 0.5 kPa or more and 2 kPa or less, for example. Pressure P2 is maintained in chamber 6 between time T3 and time T4. Silicon carbide source material 12 starts to sublimate between time T2 and time T3. The sublimated silicon carbide is recrystallized on surface 11b of seed crystal 11. Pressure P2 is maintained in chamber 6 between time T3 and time T4. Between time T3 and time T4, silicon carbide source material 12 continues to sublimate, whereby a silicon carbide single crystal 20 (see FIG. 13) is grown on surface 11b of seed crystal 11. That is, silicon carbide single crystal 20 is grown on surface 11b of seed crystal 11 by the sublimation of silicon carbide source material 12 with first resistive heater 1, second resistive heater 10 and third resistive heater 3. Preferably, in the step of growing a silicon carbide single crystal, the pressure in chamber 6 is maintained at 0.5 kPa or more and 2 kPa or less.

Preferably, in the step of growing a silicon carbide single crystal, the temperature of second resistive heater 10 is 2000° C. or more and 2400° C. or less, and the value (second current density) obtained by dividing the value of the current (second current) flowing through second resistive heater 10 by the cross-sectional area (second cross-sectional area. CS: see FIG. 9) of second resistive heater 10 perpendicular to the direction in which the second current flows is maintained at 5 A/mm$^2$ or less. Preferably, the second current density is maintained at 5 A/mm$^2$ or less between time T2 and time T5, and more preferably, the second current density is maintained at 5 A/mm$^2$ or less between time T3 and time T4. Preferably, the second current density is maintained at 4 A/mm$^2$ or less, and more preferably at 3 A/mm$^2$ or less. When the minimum value of the cross-sectional area of second resistive heater 10 is 100 mm$^2$, for example, electric power supplied to second resistive heater 10 is adjusted such that the current flowing through second resistive heater 10 is 500 A or less. The power supplied to second resistive heater 10 is 5 kW or more and 100 kW or less, for example. In the step of growing a silicon carbide single crystal, an average temperature of second resistive heater 10 may be 2000° C. or more and 2400° C. or less, and the temperature of second resistive heater 10 may vary.

Preferably, in the step of growing a silicon carbide single crystal, the temperature of first resistive heater 1 is 2000° C. or more and 2400° C. or less, and the value (first current density) obtained by dividing the value of the current (first current) flowing through first resistive heater 1 by the cross-sectional area (first cross-sectional area) of first resistive heater 1 perpendicular to the direction in which the first current flows is maintained at 5 A/mm$^2$ or less. Preferably, the first current density is maintained at 4 A/mm$^2$ or less, and more preferably at 3 A/mm$^2$ or less. When the minimum value of the cross-sectional area of first resistive heater 1 is 100 mm$^2$, for example, electric power supplied to first resistive heater 1 is adjusted such that the current flowing through first resistive heater 1 is 500 A or less. The power supplied to first resistive heater 1 is 5 kW or more and 100 kW or less, for example. In the step of growing a silicon carbide single crystal, an average temperature of first resistive heater 1 may be 2000° C. or more and 2400° C. or less, and the temperature of first resistive heater 1 may vary.

Preferably, the temperature of third resistive heater 3 is 2000° C. or more and 2400° C. or less, and the value (third current density) obtained by dividing the value of the current (third current) flowing through third resistive heater 3 by the cross-sectional area (third cross-sectional area) of third resistive heater 3 perpendicular to the direction in which the third current flows is maintained at 5 A/mm$^2$ or less. Preferably, the third current density is maintained at 4 A/mm$^2$ or less, and more preferably at 3 A/mm$^2$ or less. When the minimum value of the cross-sectional area of third resistive heater 3 is 100 mm$^2$, for example, electric power supplied to third resistive heater 3 is adjusted such that the current flowing through third resistive heater 3 is 500 A or less. The power supplied to third resistive heater 3 is 5 kW or more and 100 kW or less, for example. In the step of growing a silicon carbide single crystal, an average temperature of third resistive heater 3 may be 2000° C. or more and 2400° C. or less, and the temperature of third resistive heater 3 may vary.

Figure 12:
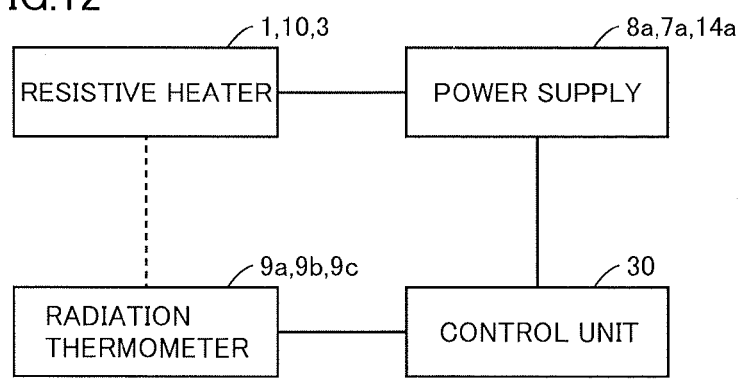
FIG. 12 is a functional block diagram showing a method of performing feedback control of electric power supplied to the resistive heaters.

In the step of growing a silicon carbide single crystal, silicon carbide source material 12 is maintained at a temperature at which the silicon carbide is sublimated, and seed crystal 11 is maintained at a temperature at which the silicon carbide is recrystallized. Specifically, the temperature of each of silicon carbide source material 12 and seed crystal 11 is controlled as follows, for example. The temperature of bottom surface 5b2 is measured by lower radiation thermometer 9a. As shown in FIG. 12, the temperature of bottom surface 5b2 measured by lower radiation thermometer 9a is transmitted to a control unit 30. In control unit 30, the temperature of bottom surface 5b2 is compared with a desired temperature. When the temperature of bottom surface 5b2 is higher than the desired temperature, a command to reduce the power supplied to first resistive heater 1 is issued to first power supply 8a (see FIG. 5), for example. In contrast, when the temperature of bottom surface 5b2 is lower than the desired temperature, a command to increase the power supplied to first resistive heater 1 is issued to first power supply 8a (see FIG. 5), for example. That is, first power supply 8a supplies the power to first resistive heater 1 based on the command from control unit 30. In this manner, the temperature of bottom surface 5b2 is controlled to be the desired temperature by determining the power supplied to first resistive heater 1 based on the temperature of bottom surface 5b2 measured by lower radiation thermometer 9a. Alternatively, the temperature of bottom surface 5b2 may be controlled to be the desired temperature by determining the power supplied to first resistive heater 1 based on the temperature of first resistive heater 1 measured by lower radiation thermometer 9a. Still alternatively, the temperature of bottom surface 5b2 may be controlled to be the desired temperature by determining the power supplied to first resistive heater 1 based on the temperatures of both first resistive heater 1 and bottom surface 5b2.

Likewise, the temperature of side surface 5b1 is controlled to be a desired temperature by determining the power supplied to second resistive heater 10 based on the temperature of side surface 5b1 measured by lateral radiation thermometer 9b. Alternatively, the temperature of side surface 5b1 may be controlled to be the desired temperature by determining the power supplied to second resistive heater 10 based on the temperature of second resistive heater 10 measured by lateral radiation thermometer 9b. Still alternatively, the temperature of side surface 5b1 may be controlled to be the desired temperature by determining the power supplied to second resistive heater 10 based on the temperatures of both second resistive heater 10 and side surface 5b1.

Likewise, the temperature of top surface 5a1 is controlled to be a desired temperature by determining the power supplied to third resistive heater 3 based on the temperature of top surface 5a1 measured by upper radiation thermometer 9c. Alternatively, the temperature of top surface 5a1 may be controlled to be the desired temperature by determining the power supplied to third resistive heater 3 based on the temperature of third resistive heater 3 measured by upper radiation thermometer 9c. Still alternatively, the temperature of top surface 5a1 may be controlled to be the desired temperature by determining the power supplied to third resistive heater 3 based on the temperatures of both third resistive heater 3 and top surface 5a1.

Then, between time T4 and time T5, the pressure in chamber 6 increases from pressure P2 to pressure P1 (see FIG. 1.1). As the pressure in chamber 6 increases, the sublimation of silicon carbide source material 12 is suppressed. The step of growing a silicon carbide single crystal is thus substantially completed. The heating of crucible 5 is stopped at time T6, and crucible 5 is cooled. After the temperature of crucible 5 approaches the room temperature, silicon carbide single crystal 20 is removed from crucible 5.

[2-3. First Variation of Apparatus of Manufacturing Silicon Carbide Single Crystal]

Next, the configuration of a first variation of the apparatus of manufacturing a silicon carbide single crystal according to the present embodiment is described.

Figure 14:
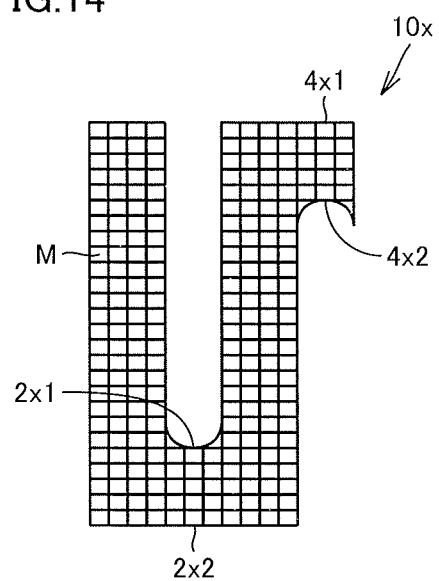
FIG. 14 is a schematic side view showing the configuration of a resistive heater according to a first variation of the embodiment, which shows the shape of a unit of a resistive heater model for use in thermal analysis simulation.

Second resistive heater 10 may be configured such that, when the average temperature of second resistive heater 10 is 2000° C. or more and 2400° C. or less, a difference between a maximum temperature and a minimum temperature of second resistive heater 10 is 100° C. or less. That is, the average temperature of second resistive heater 10 is 2000° C. or more and 2400° C. or less at a certain point in time, and a difference between a maximum temperature and a minimum temperature in a temperature distribution of second resistive heater 10 is 100° C. or less at that point in time. Preferably, the difference between the maximum temperature and the minimum temperature of second resistive heater 10 is 95° C. or less, more preferably 90° C. or less, more preferably 85° C. or less, and more preferably 80° C. or less. The maximum temperature and the minimum temperature of second resistive heater 10 can be determined by thermal analysis simulation, for example. As a thermal analysis program for use in the thermal analysis simulation, STAR-CCM+® manufactured by IDAJ Co., LTD. can be used, for example. As shown in FIG. 14, a shape model of heater unit 10x is fabricated, for example, and the model is partitioned into a plurality of mesh regions M. Mesh regions M each have a size of 0.5 mm, for example. The maximum temperature of second resistive heater 10 is determined as a temperature of a region having a maximum temperature of all mesh regions M forming the model. Likewise, the minimum temperature of second resistive heater 10 is determined as a temperature of a region having a minimum temperature of all mesh regions M forming the model. The average temperature of second resistive heater 10 is determined as an average temperature of all mesh regions M forming the model.

The temperature of each of the plurality of mesh regions M is calculated with the thermal analysis program described above. As a result of the thermal analysis simulation, it was found that the temperatures of regions including fifth surface 2x1 of second portion 2x and regions including ninth surface 4x2 of fourth portion 4x tend to be higher than the average temperature. By making fifth surface 2x1 of second portion 2x and ninth surface 4x2 of fourth portion 4x as curved surfaces, therefore, the increase in temperature of fifth surface 2x1 of second portion 2x and ninth surface 4x2 of fourth portion 4x can be suppressed. Preferably, radius of curvature r of each of fifth surface 2x1 and ninth surface 4x2 is 5 mm or more and 20 mm or less.

Preferably, second resistive heater 10 is made of carbon. The carbon has a density of 1.6 g/cm$^3$ or more and 2.0 g/cm$^3$ or less, for example, and preferably 1.7 g/cm$^3$ or more and 1.9 g/cm$^3$ or less. The carbon has a resistivity of 1100 mΩ·cm or more and 1.800 mΩ·cm or less, for example, and preferably 1200 mΩ·cm or more and 1700 mΩ·cm or less.

Next, a first variation of the method of manufacturing a silicon carbide single crystal according to the present embodiment is described.

In the step of growing a silicon carbide single crystal (S30: FIG. 7), the difference between the maximum temperature and the minimum temperature of second resistive heater 10 may be maintained at 100° C. or less. Preferably, the difference between the maximum temperature and the minimum temperature of second resistive heater 10 is maintained at 100° C. or less between time T2 and time T5, and more preferably, the difference between the maximum temperature and the minimum temperature of second resistive heater 10 is maintained at 100° C. or less between time T3 and time T4 (see FIGS. 10 and 11). Preferably, the difference between the maximum temperature and the minimum temperature of second resistive heater 10 is maintained at 95° C. or less, more preferably at 90° C. or less, more preferably at 85° C. or less, and more preferably at 80° C. or less. Preferably, in the step of growing a silicon carbide single crystal, the average temperature of second resistive heater 10 is 2000° C. or more and 2400° C. or less, the difference between the maximum temperature and the minimum temperature of second resistive heater 10 is maintained at 100° C. or less, and the pressure in the chamber is maintained at 0.5 kPa or more and 2 kPa or less. In the step of growing a silicon carbide single crystal, the average temperature of second resistive heater 10 may be 2000° C. or more and 2400° C. or less, and the temperature of second resistive heater 10 may vary.

[2-4. Second Variation of Apparatus of Manufacturing Silicon Carbide Single Crystal]

Next, the configuration of a second variation of the apparatus of manufacturing a silicon carbide single crystal according to the present embodiment is described.

Figure 15:
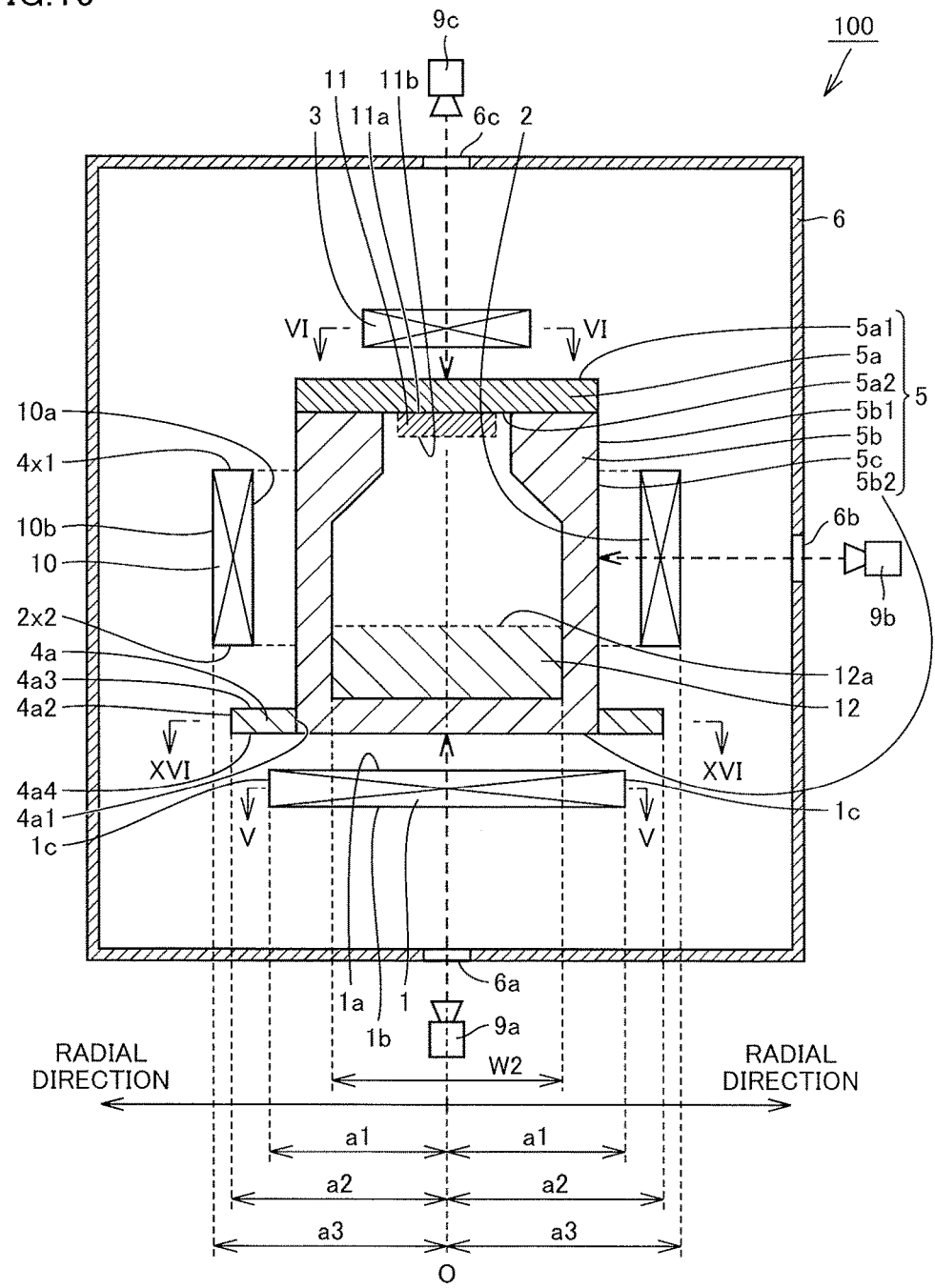
FIG. 15 is a schematic vertical sectional view showing the configuration of a second variation of the apparatus of manufacturing a silicon carbide single crystal according to the embodiment.

As shown in FIG. 15, apparatus 100 of manufacturing a silicon carbide single crystal may further include a first partition unit 4a. First partition unit 4a is provided so as to at least partially prevent radiant light from second resistive heater 10 from reaching first resistive heater 1. Likewise, first partition unit 4a is provided so as to at least partially prevent radiant light from first resistive heater 1 from reaching second resistive heater 10. First partition unit 4a is provided so as to at least partially block radiant light emitted directly from second resistive heater 10 toward first resistive heater 1. That is, first partition unit 4a is provided between second resistive heater 10 and first resistive heater 1 so as to suppress the transfer of heat of second resistive heater 10 to first resistive heater 1.

First partition unit 4a is located outside of a portion 5c of side surface 5b1 of crucible 5 facing second resistive heater 10. First partition unit 4a may be formed as one piece with or as a separate unit from crucible 5. Preferably, first partition unit 4a has a surface 4a1 in contact with side surface 5b1, an outer end portion 4a2 opposite to surface 4a1, an upper surface 4a3 toward top surface 5a1 of crucible 5, and a lower surface 4a4 toward bottom surface 5b2 of crucible 5. Preferably, the first partition unit is in contact with side surface 5b1 of accommodation unit 5b of crucible 5, and provided to project from side surface 5b1 to the outside of crucible 5. Preferably, lower surface 4a4 of first partition unit 4a faces upper surface 1a of first resistive heater 1. Preferably, upper surface 4a3 of first partition unit 4a faces sixth surface 2x2 of second resistive heater 10. That is, first partition unit 4a is located toward sixth surface 2x2 of second resistive heater 10. Preferably, when viewed along a direction perpendicular to bottom surface 5b2, first partition unit 4a partially overlaps with upper surface 1a of first resistive heater 1. Preferably, when viewed along the direction perpendicular to bottom surface 5b2, first partition unit 4a partially overlaps with sixth surface 2x2 of second resistive heater 10.

Preferably, when viewed from internal space of crucible 5, in the direction parallel to bottom surface 5b2 of crucible 5, outer circumferential surface 10b of second resistive heater 10 is located more distally than outer end portion 4a2 of first partition unit 4a, and outer end portion 4a2 of first partition unit 4a is located more distally than an outer end portion 1c of first resistive heater 1. In other words, a distance a3 from a central axis O of tubular side surface 5b1 to outer circumferential surface 10b of second resistive heater 10 is greater than a distance a2 from central axis O to outer end portion 4a2 of first partition unit 4a, and distance a2 from central axis O to outer end portion 4a2 of first partition unit 4a is greater than a distance a1 from central axis O to outer end portion 1c of first resistive heater 1.

Figure 16:
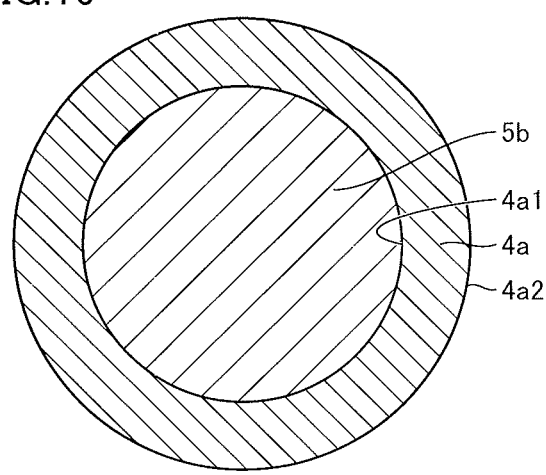
FIG. 16 is a schematic transverse sectional view taken along line XVI-XVI in a direction of arrows in FIG. 15, which shows the configuration of a first partition unit and an accommodation unit.

As shown in FIG. 16, first partition unit 4a is preferably provided to project from the entire circumference of side surface 5b1 of crucible 5 to the outside of crucible 5. When viewed along the direction from top surface 5a1 toward bottom surface 5b2, first partition unit 4a is provided to surround accommodation unit 5b of crucible 5. When viewed along the direction from top surface 5a1 toward bottom surface 5b2, first partition unit 4a has a ring shape. First partition unit 4a may be formed to project from part of the circumference of side surface 5b1 to the outside of crucible 5. First partition unit 4a is made of carbon, for example, and preferably made of graphite.

[2-5. Third Variation of Apparatus of Manufacturing Silicon Carbide Single Crystal]

Next, the configuration of a third variation of apparatus 100 of manufacturing a silicon carbide single crystal according to the present embodiment is described.

Figure 17:
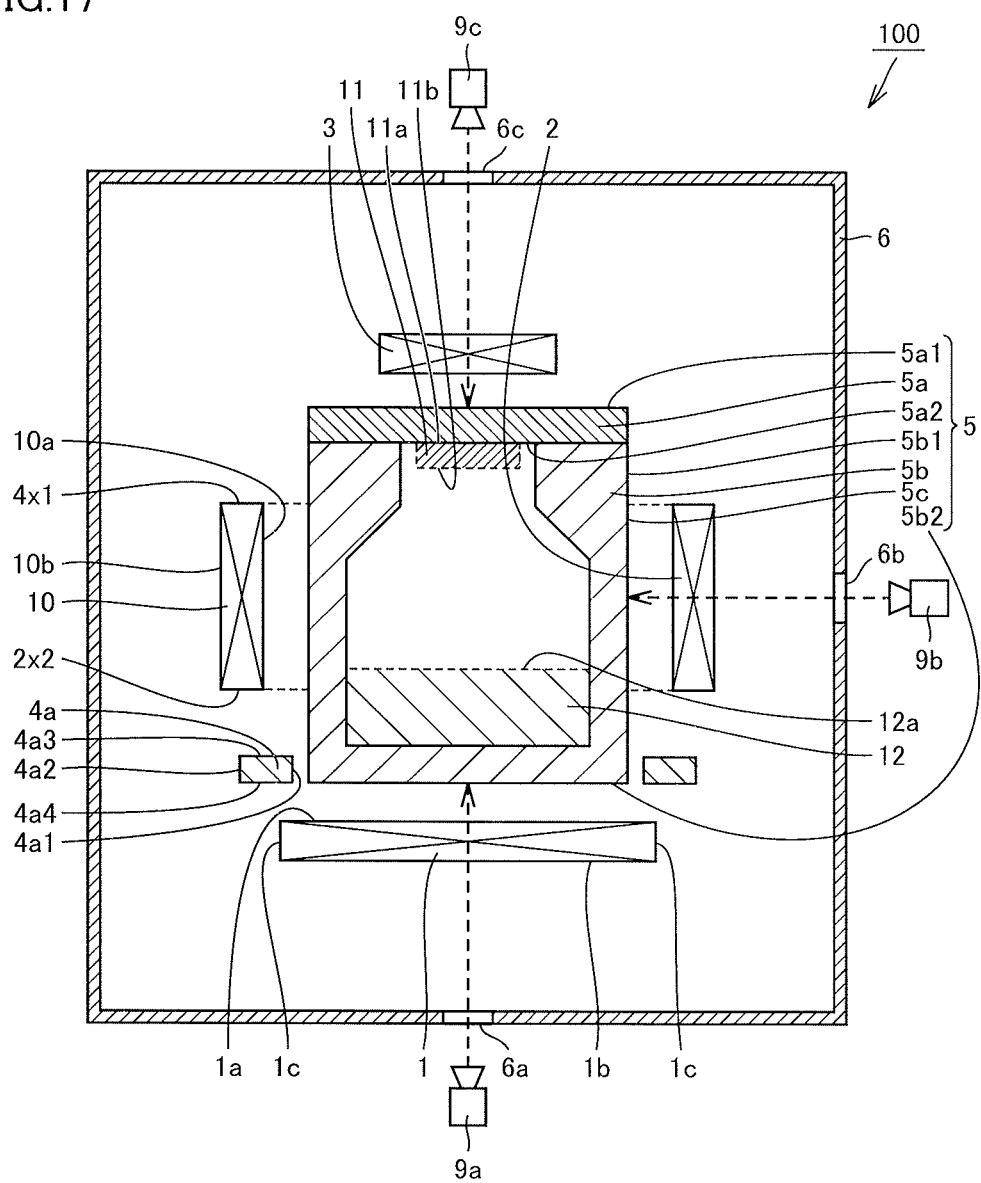
FIG. 17 is a schematic vertical sectional view showing the configuration of a third variation of the apparatus of manufacturing a silicon carbide single crystal according to the embodiment.

As shown in FIG. 17, first partition unit 4a of apparatus 100 of manufacturing a silicon carbide single crystal may be provided distant from side surface 5b1 of crucible 5. First partition unit 4a is only required to be provided so as to at least partially prevent radiant light from second resistive heater 10 from reaching first resistive heater 1, and does not need to be in contact with side surface 5b1. First partition unit 4a may be provided such that surface 4a1 of first partition unit 4a faces side surface 5b1. First partition unit 4a may be distant from the entire circumference of side surface 5b1, or may be in contact with part of the entire circumference.

[2-6. Fourth Variation of Apparatus of Manufacturing Silicon Carbide Single Crystal]

Next, the configuration of a fourth variation of apparatus 100 of manufacturing a silicon carbide single crystal according to the present embodiment is described.

Figure 18:
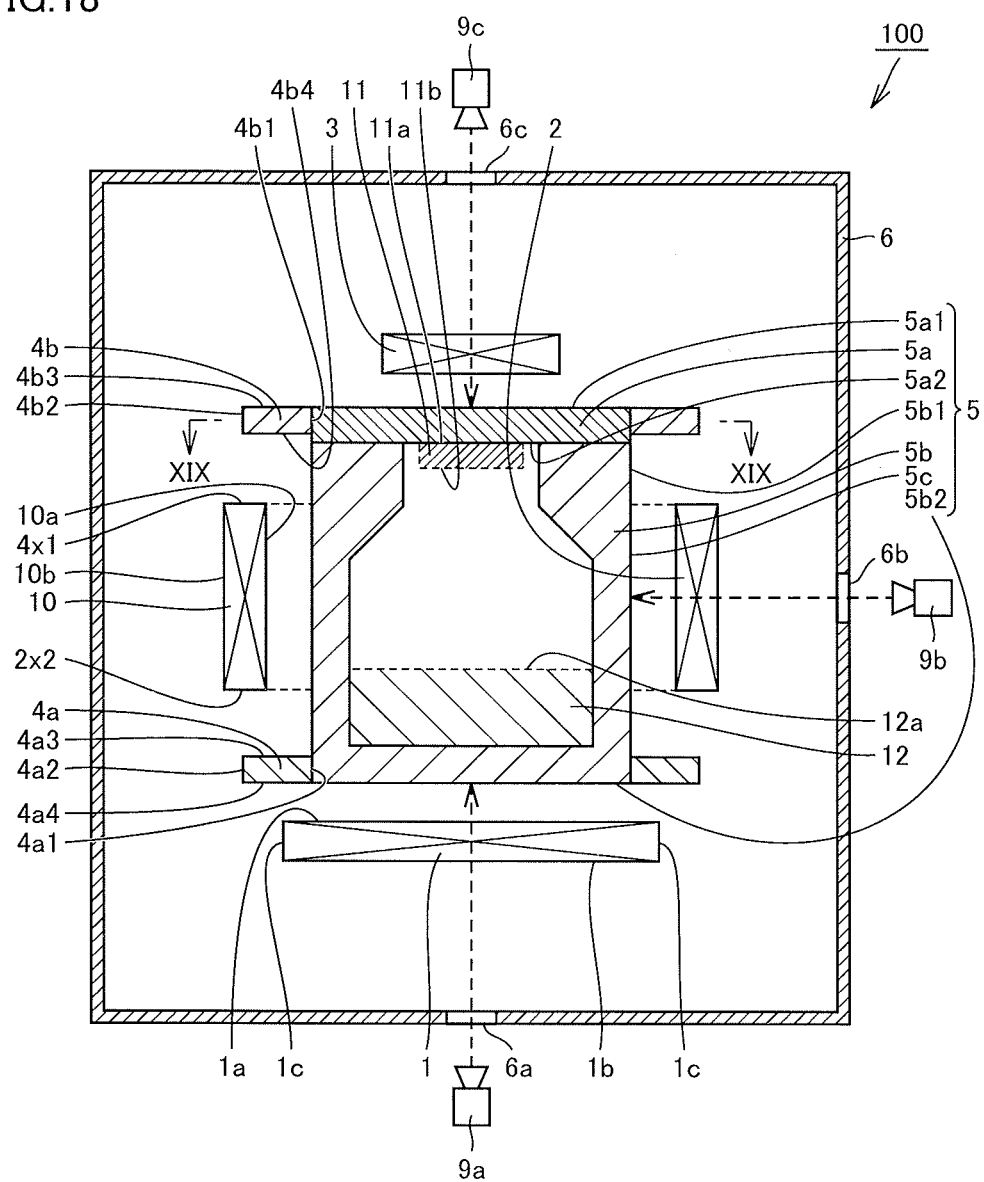
FIG. 18 is a schematic vertical sectional view showing the configuration of a fourth variation of the apparatus of manufacturing a silicon carbide single crystal according to the embodiment.

As shown in FIG. 18, apparatus 100 of manufacturing a silicon carbide single crystal may further include a second partition unit 4b. Second partition unit 4b is provided so as to at least partially prevent radiant light from second resistive heater 10 from reaching third resistive heater 3. Likewise, second partition unit 4b is provided so as to at least partially prevent radiant light from third resistive heater 3 from reaching second resistive heater 10. Second partition unit 4b is provided so as to at least partially block radiant light emitted directly from second resistive heater 10 toward third resistive heater 3. That is, second partition unit 4b is provided between second resistive heater 10 and third resistive heater 3 so as to suppress the transfer of heat of second resistive heater 10 to third resistive heater 3.

Second partition unit 4b is located outside of portion 5c of side surface 5b1 of crucible 5 facing second resistive heater 10. Second partition unit 4b may be formed as one piece with or as a separate unit from crucible 5. Preferably, second partition unit 4b has a surface 4b1 in contact with side surface 5b1, an outer end portion 4b2 opposite to surface 4b1, an upper surface 4b3 toward top surface 5a1 of crucible 5, and a lower surface 4b4 toward bottom surface 5b2 of crucible 5. Preferably, second partition unit 4b is in contact with side surface 5b1 of pedestal 5a of crucible 5, and provided to project from side surface 5b1 to the outside of crucible 5. Preferably, lower surface 4b4 of second partition unit 4b faces tenth surface 4x1 of second resistive heater 10. That is, second partition unit 4b is located toward tenth surface 4x1 of second resistive heater 10. Preferably, when viewed along the direction perpendicular to bottom surface 5b2, second partition unit 4b partially overlaps with tenth surface 4x11 of second resistive heater 10.

Preferably, when viewed from the internal space of crucible 5, in the direction parallel to bottom surface 5b2 of crucible 5, outer circumferential surface 10b of second resistive heater 10 is located more distally than outer end portion 4b2 of second partition unit 4b, and outer end portion 4b2 of second partition unit 4b is located more distally than outer end portion 1c of first resistive heater 1. Preferably, when viewed from the internal space of crucible 5, in the direction parallel to bottom surface 5b2, outer circumferential surface 10b of second resistive heater 10 is located more distally than at least one of the outer end portion of first partition unit 4a and the outer end portion of second partition unit 4b, and the at least one of the outer end portions is located more distally than outer end portion 1c of first resistive heater 1.

Figure 19:
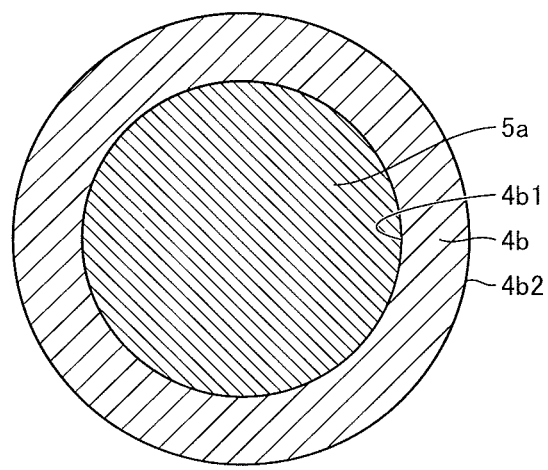
FIG. 19 is a schematic transverse sectional view taken along line XIX-XIX in a direction of arrows in FIG. 18, which shows the configuration of a second partition unit and a pedestal.

As shown in FIG. 19, second partition unit 4b is preferably provided to project from the entire circumference of side surface 5b1 of pedestal 5a of crucible 5 to the outside of crucible 5. When viewed along the direction from top surface 5a1 toward bottom surface 5b2, second partition unit 4b is provided to surround pedestal 5a of crucible 5. When viewed along the direction from top surface 5a1 toward bottom surface 5b2, second partition unit 4b has a ring shape. Second partition unit 4b may be formed to project from part of the circumference of side surface 5b1 of crucible 5 to the outside of crucible 5. Only one of first partition unit 4a and second partition unit 4b may be provided to project from the entire circumference of side surface 5b1 to the outside of crucible 5, or both of first partition unit 4a and second partition unit 4b may be provided to project from the entire circumference of side surface 5b1 to the outside of crucible 5. Second partition unit 4b is made of carbon, for example, and preferably made of graphite.

[2-7. Fifth Variation of Apparatus of Manufacturing Silicon Carbide Single Crystal]

Next, the configuration of a fifth variation of apparatus 100 of manufacturing a silicon carbide single crystal according to the present embodiment is described.

Figure 20:
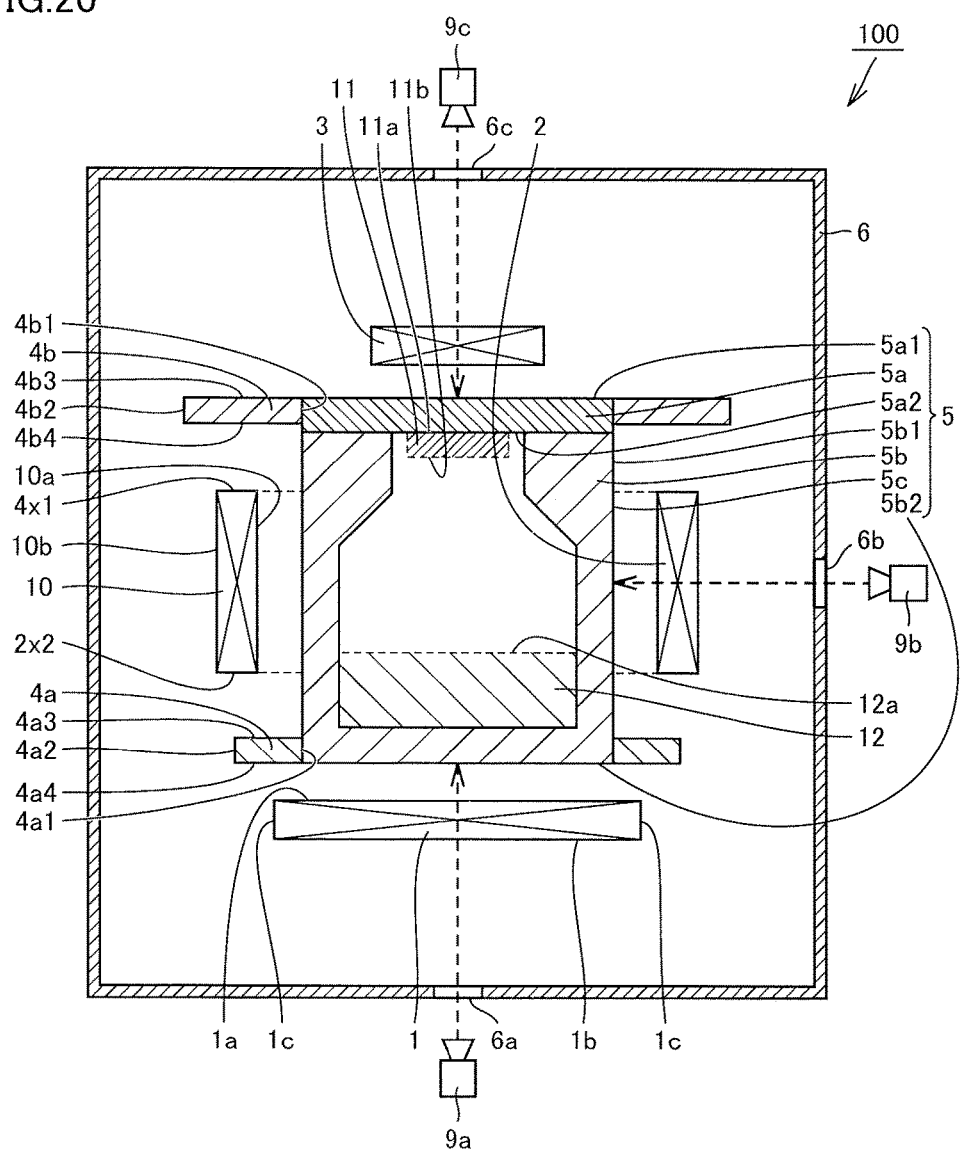
FIG. 20 is a schematic vertical sectional view showing the configuration of a fifth variation of the apparatus of manufacturing a silicon carbide single crystal according to the embodiment.

As shown in FIG. 20, in the direction parallel to top surface 5a1 of crucible 5, outer end portion 4b2 of second partition unit 4b may be located outside of outer circumferential surface 10b of second resistive heater 10. In other words, when viewed from the internal space of crucible 5, in the direction parallel to top surface 5a1, outer end portion 4b2 of second partition unit 4b may be located more distally than outer circumferential surface 10b of second resistive heater 10, and may also be located more distally than outer end portion 4a2 of first partition unit 4a.

[2-8. Sixth Variation of Apparatus of Manufacturing Silicon Carbide Single Crystal]

Next, the configuration of a sixth variation of apparatus 100 of manufacturing a silicon carbide single crystal according to the present embodiment is described.

Figure 21:
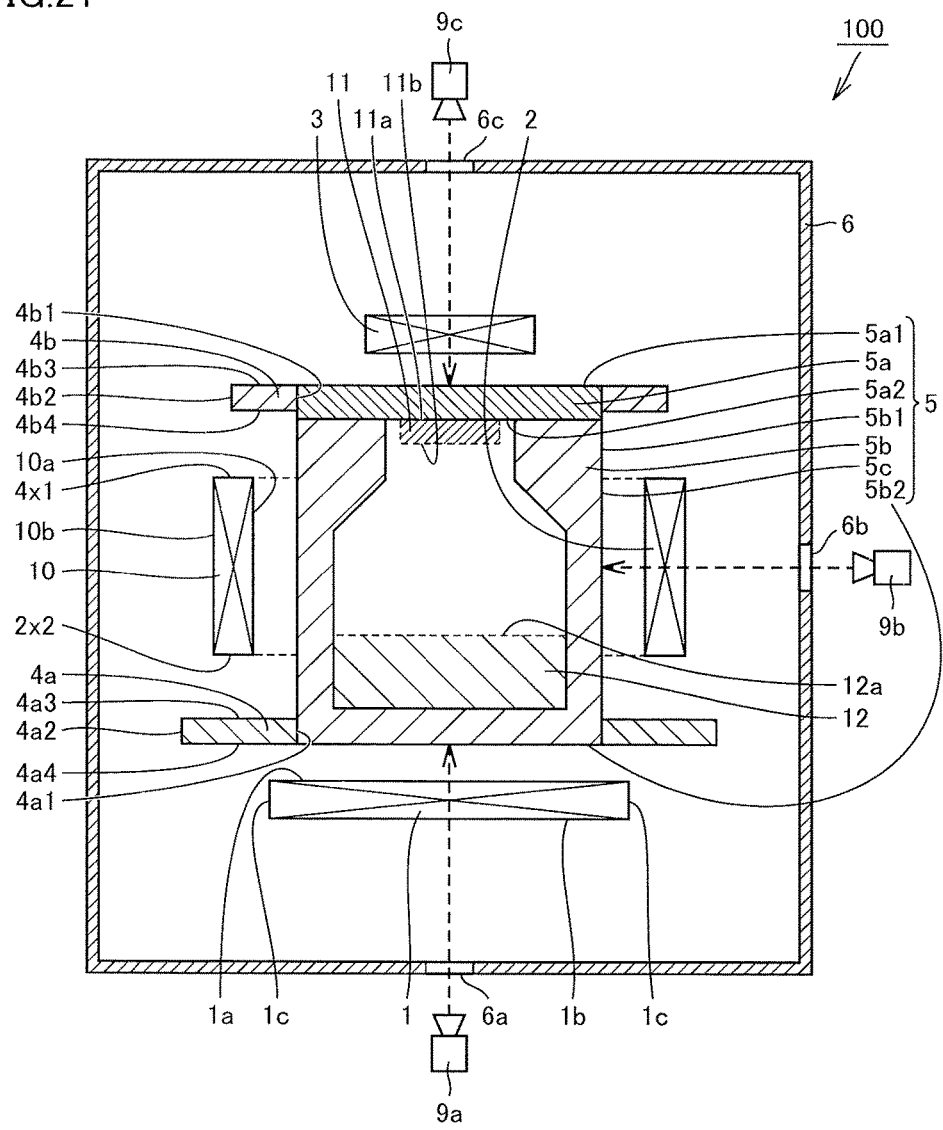
FIG. 21 is a schematic vertical sectional view showing the configuration of a sixth variation of the apparatus of manufacturing a silicon carbide single crystal according to the embodiment.

As shown in FIG. 21, in the direction parallel to top surface 5a1 of crucible 5, outer end portion 4a2 of first partition unit 4a may be located outside of outer circumferential surface 10b of second resistive heater 10. In other words, when viewed from the internal space of crucible 5, in the direction parallel to top surface 5a1, outer end portion 4a2 of first partition unit 4a may be located more distally than outer circumferential surface 10b of second resistive heater 10, and may also be located more distally than outer end portion 4b2 of second partition unit 4b.

[2-9. Seventh Variation of Apparatus of Manufacturing Silicon Carbide Single Crystal]

Next, the configuration of a seventh variation of apparatus 100 of manufacturing a silicon carbide single crystal according to the present embodiment is described.

Figure 22:
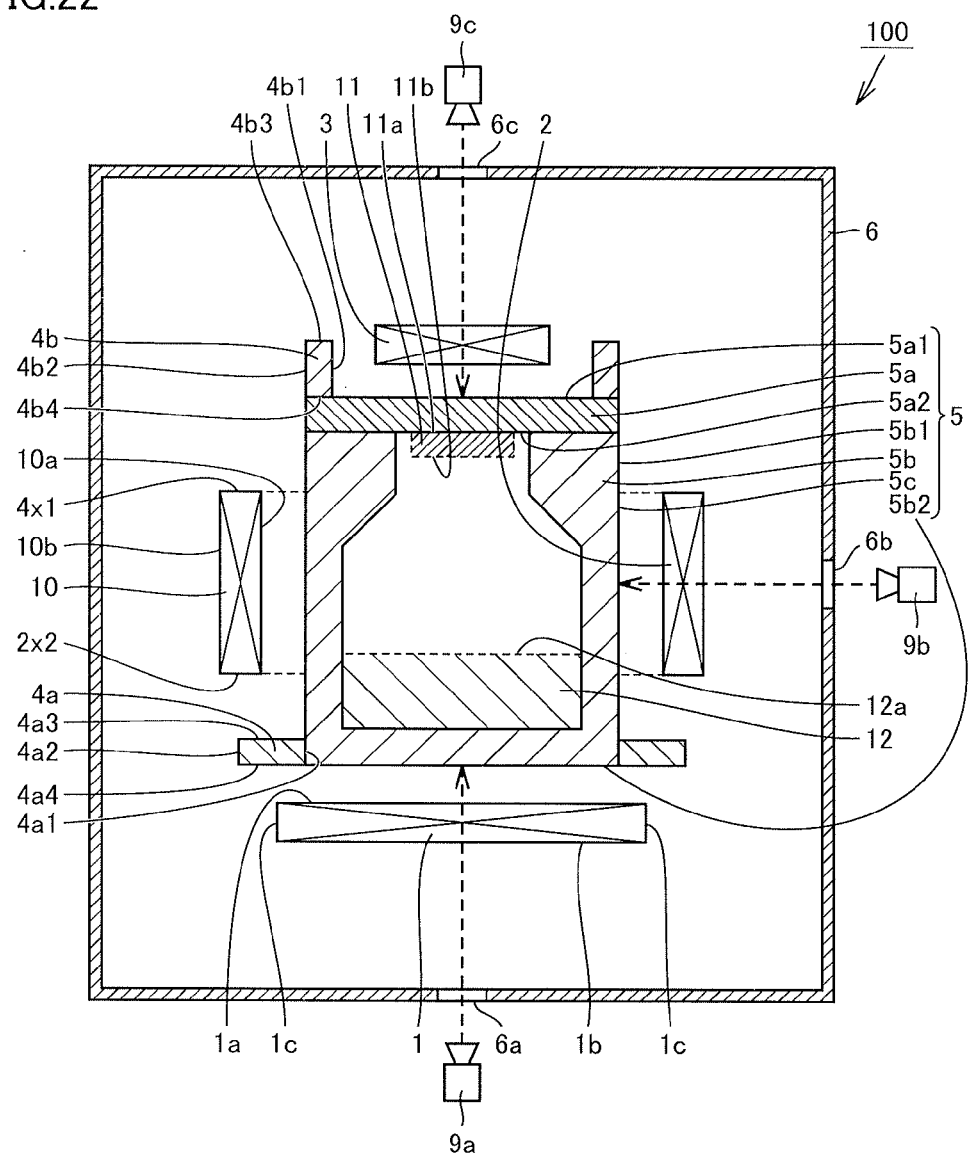
FIG. 22 is a schematic vertical sectional view showing the configuration of a seventh variation of the apparatus of manufacturing a silicon carbide single crystal according to the embodiment.

As shown in FIG. 22, second partition unit 4b may project upward from top surface 5a1 of crucible 5. Second partition unit 4b may be in contact with top surface 5a1 rather than side surface 5b1 of crucible 5. Second partition unit 4b may be formed as one piece with or as a separate unit from pedestal 5a. Second partition unit 4b is provided to face third resistive heater 3. Second partition unit 4b may have a cylindrical shape so as to surround third resistive heater 3.

Next, a second variation of the method of manufacturing a silicon carbide single crystal according to the present embodiment is described.

First, a step of preparing an apparatus of manufacturing a silicon carbide single crystal (S10: FIG. 7) is performed. For example, apparatus 100 of manufacturing a silicon carbide single crystal according to the second to seventh variations described above is prepared. Manufacturing apparatus 100 including crucible 5 having top surface 5a1, bottom surface 5b2 opposite to top surface 5a1, and tubular side surface 5b1 located between top surface 5a1 and bottom surface 5b2, first resistive heater 1 provided to face bottom surface 5b2, second resistive heater 10 arranged to surround side surface 5b1, and partition unit 4a located outside of portion 5c of side surface 5b1 of crucible 5 facing second resistive heater 10 is thus prepared (see FIG. 15). Next, a step of preparing a silicon carbide source material and a seed crystal (S20: FIG. 7) is performed. Specifically, as shown in FIG. 23, seed crystal 11 and silicon carbide source material 12 are placed in crucible 5. Silicon carbide source material 12 is provided in accommodation unit 5b of crucible 5.

Figure 24:
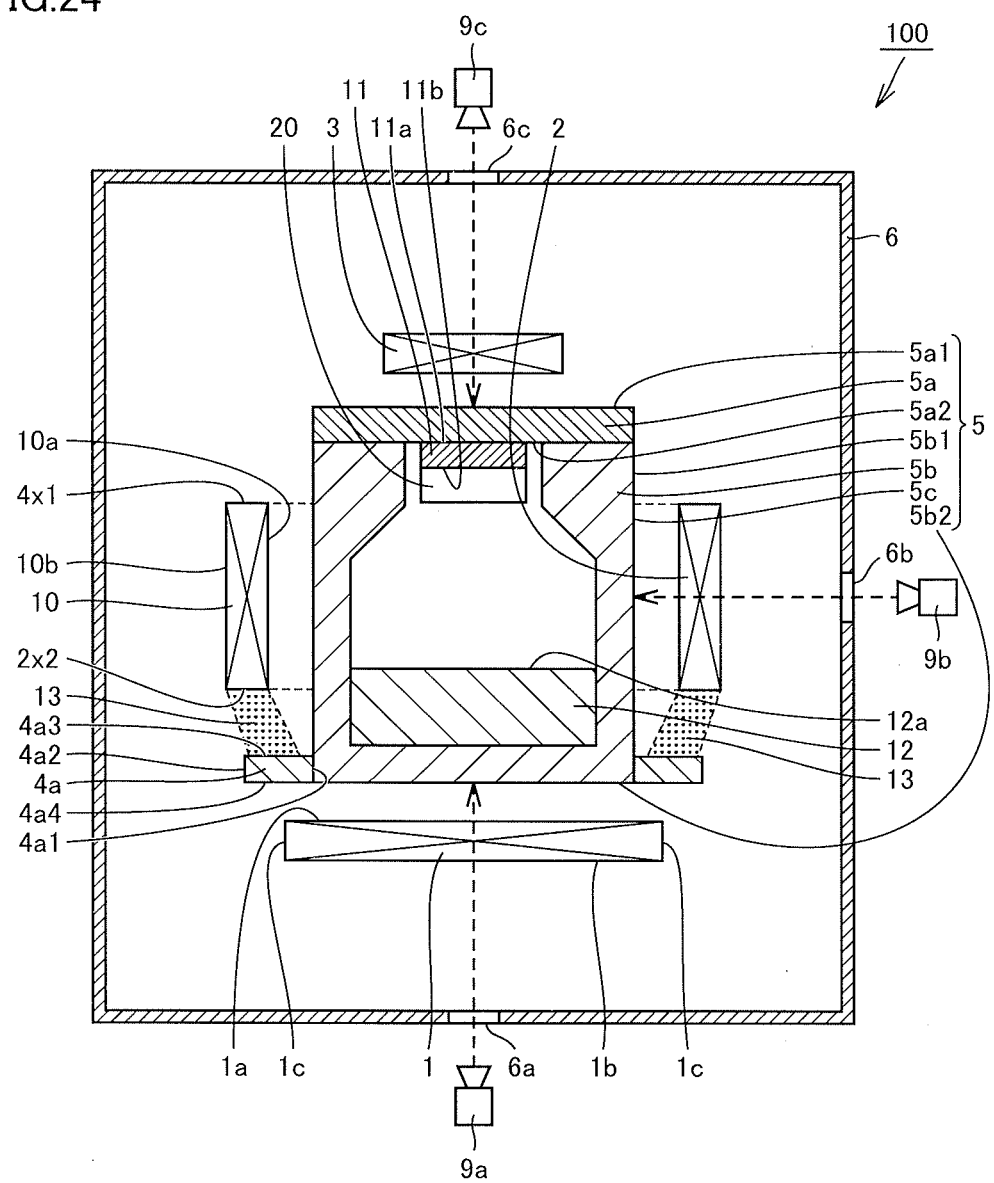
FIG. 24 is a schematic vertical sectional view showing a variation of the second step of the method of manufacturing a silicon carbide single crystal according to the embodiment.

Next, a step of growing a silicon carbide single crystal (S30: FIG. 7) is performed. As shown in FIG. 23, partition unit 4a is provided so as to at least partially prevent radiant light 13 from second resistive heater 10 from reaching first resistive heater 1. Preferably, first partition unit 4a is provided so as to completely block radiant light emitted directly from second resistive heater 10 toward first resistive heater 1. As shown in FIGS. 23 and 24, in the step of growing silicon carbide single crystal 20 (specifically between time T2 and time T5 in FIGS. 10 and 11), with partition unit 4a provided so as to at least partially prevent radiant light 13 from second resistive heater 10 from reaching first resistive heater 1, electric power supplied to first resistive heater 1 may be determined based on the temperature of at least one of bottom surface 5b2 of crucible 5 and first resistive heater 1, and electric power supplied to second resistive heater 10 may be determined based on the temperature of at least one of side surface 5b1 of crucible 5 and second resistive heater 10. Preferably, in the step of growing silicon carbide single crystal 20, with partition unit 4a provided so as to at least partially prevent radiant light 13 from second resistive heater 10 from reaching first resistive heater 1, electric power supplied to third resistive heater 3 may be determined based on the temperature of at least one of top surface 5a1 of crucible 5 and third resistive heater 3.

Likewise, in the step of growing silicon carbide single crystal 20, with partition unit 4b provided so as to at least partially prevent radiant light from second resistive heater 10 from reaching third resistive heater 3, electric power supplied to third resistive heater 3 may be determined based on the temperature of at least one of top surface 5a1 of crucible 5 and third resistive heater 3, and electric power supplied to second resistive heater 10 may be determined based on the temperature of at least one of side surface 5b1 of crucible 5 and second resistive heater 10 (see FIG. 18).

3. Evaluation (Evaluation 1)

First, resistive heaters made of graphite having a density of 1.75 g/cm$^3$ (samples 1 to 7) and resistive heaters made of carbon having a density of 1.85 g/cm$^3$ (samples 8 to 14) are prepared. The resistance of each of the resistive heaters (samples 1 to 14) before a supply of current is measured. Then, under an environment at a temperature of about 2200° C., a current is supplied to each of the resistive heaters (samples 1 to 14) for 100 hours. The currents to flow through the resistive heaters are adjusted such that the resistive heaters according to samples 1 to 7 have a current density of 2 A/mm$^2$, 3 A/mm$^2$, 4 A/mm$^2$, 5 A/mm$^2$, 6 A/mm$^2$, 7 A/mm$^2$ and 8 A/mm$^2$, respectively. Likewise, the currents to flow through the resistive heaters are adjusted such that the resistive heaters according to samples 8 to 14 have a current density of 2 A/mm$^2$, 3 A/mm$^2$, 4 A/mm$^2$, 5 A/mm$^2$, 6 A/mm$^2$, 7 A/mm$^2$ and 8 A/mm$^2$, respectively. The current density of the resistive heater is adjusted by changing the current supplied to the resistive heater without changing the cross-sectional area of the resistive heater. Specifically, the cross-sectional area of the resistive heaters according to samples 1 to 14 is set to 150 mm$^2$. The currents supplied to the resistive heaters according to samples 1 to 7 are set to 300 A, 450 A, 600 A, 750 A, 900 A, 1050 A and 1200 A, respectively. Likewise, the currents supplied to the resistive heaters according to samples 8 to 14 are set to 300 A, 450 A, 600 A, 750 A, 900 A, 1050 A and 1200 A, respectively.

After the supply of electric power for 100 hours, the resistance of each of the resistive heaters (samples 1 to 1.4) is measured. After the supply of electric power, the resistance increases in all the resistive heaters. By dividing a difference between the resistance of the resistive heater after the supply of electric power and the resistance of the resistive heater before the supply of electric power by the resistance of the resistive heater before the supply of electric power, a rate of resistance increase (%) after 100 hours of current passage is calculated. It is noted that the carbon forming the resistive heater is degraded when electric power is supplied to the resistive heater for a long period of time. Particularly, when a temperature of the resistive heater reaches a temperature of 2000° C. or more and 2400° C. or less, for example, and a pressure in a chamber in which the resistive heater is placed is about 1 kPa, for example, the resistive heater is degraded due to sublimation of the carbon forming the resistive heater. The sublimation of the carbon forming the resistive heater causes an increase in resistance of the resistive heater. Further, in the step of growing a silicon carbide single crystal, silicon is produced by sublimating a silicon carbide source material. The carbon is etched by the silicon. It is thus believed that the degradation of the resistive heater is facilitated in the step of growing a silicon carbide single crystal.

Figure 30:
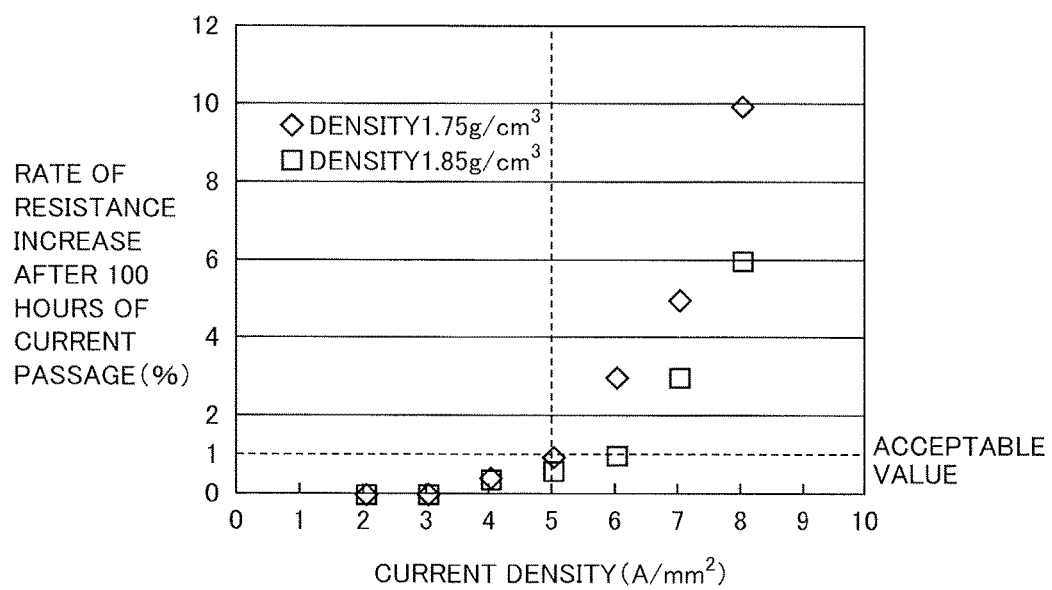
FIG. 30 is a diagram showing relation between a rate of resistance increase after 100 hours of current passage and current density.

FIG. 30 is a diagram showing relation between the rate of resistance increase of the resistive heater after 100 hours of current passage and the current density of the resistive heater during the current passage through the resistive heater. A vertical axis in FIG. 30 represents the rate of resistance increase (%) of the resistive heater after 100 hours of current passage, and a horizontal axis represents the current density (A/mm$^2$) of the resistive heater during the current passage through the resistive heater. It is noted that an acceptable value of the rate of resistance increase (%) of the resistive heater after 100 hours of current passage is 1% or less. Rhombus symbols indicate the resistive heaters made of graphite having a density of 1.75 g/cm$^3$ (samples 1 to 7). Square symbols indicate the resistive heaters made of carbon having a density of 1.85 g/cm$^3$ (samples 8 to 14).

As shown in FIG. 30, when the current density of the resistive heater is 5 A/mm² or less, the rate of resistance increase of the resistive heater after 100 hours of current passage is 1% or less. When the current density of the resistive heater becomes higher than 5 A/mm², the rate of resistance increase of the resistive heater after 100 hours of current passage increases sharply. When compared at the same current density, the resistive heater having a higher carbon density has a smaller rate of resistance increase than the resistive heater having a lower carbon density. From these results, the degradation of the resistive heater can be effectively suppressed by setting the current density of the resistive heater to 5 A/mm² or less.

(Evaluation 2)

First, resistive heaters 10 according to samples 1 to 6 are prepared. Resistive heaters 10 according to Group 1 are samples 1 to 5, and resistive heater 10 according to Group 2 is sample 6. Resistive heaters 10 according to samples 1 to 6 each include first portion 1x, second portion 2x, third portion 3x, and fourth portion 4x (see FIGS. 3 and 4). Distance a between second surface 1x2 of first portion 1x and fourth surface 3x2 of third portion 3x in the circumferential direction, distance b between first surface 1x1 of first portion 1x and third surface 3x1 of third portion 3x in the circumferential direction, shortest distance c between fifth surface 2x1 and sixth surface 2x2 of second portion 2x in the direction from top surface 5a1 toward bottom surface 5b2, and radius of curvature r of fifth surface 2x1 of second portion 2x when viewed along the direction perpendicular to side surface 5b1 are designed as indicated in Table 1. Specifically, in resistive heater 10 according to sample 1, distance a is set to 50 mm, distance b is set to 15 mm, shortest distance c is set to 20 mm, and radius of curvature r is set to 7.5 mm. In resistive heater 10 according to sample 2, distance a is set to 60 mm, distance b is set to 15 mm, shortest distance c is set to 20 mm, and radius of curvature r is set to 7.5 mm. In resistive heater 10 according to sample 3, distance a is set to 50 mm, distance b is set to 10 mm, shortest distance c is set to 15 mm, and radius of curvature r is set to 5 mm. In resistive heater 10 according to sample 4, distance a is set to 50 mm, distance b is set to 15 mm, shortest distance c is set to 25 mm, and radius of curvature r is set to 7.5 mm. In resistive heater 10 according to sample 5, distance a is set to 50 mm, distance b is set to 15 mm, shortest distance c is set to 20 mm, and radius of curvature r is set to 10 mm. In resistive heater 10 according to sample 6, distance a is set to 40 mm, distance b is set to 15 mm, shortest distance c is set to 10 mm, and radius of curvature r is set to 4 mm.

Then, a maximum temperature and a minimum temperature of each of resistive heaters 10 according to samples 1 to 6 are calculated by thermal analysis simulation to determine a difference between the maximum temperature and the minimum temperature (temperature difference) of resistive heater 10. As a thermal analysis program for use in the thermal analysis simulation, STAR-CCM+® manufactured by IDAJ Co., LTD. is used. Mesh regions M of the shape model of resistive heater 10 (see FIG. 14) each have a size of 0.5 mm. The carbon forming resistive heater 10 has a density of 1.75 g/cm². Resistive heater 10 has an average temperature of 2200° C. Resistive heater 10 has a thickness of 15 mm in the direction perpendicular to side surface 5b1.

Then, silicon carbide single crystals 20 are manufactured with resistive heaters 10 according to samples 1 to 6, and the crystalline quality of each of silicon carbide single crystals 20 is evaluated. The crystalline quality of the silicon carbide single crystal is evaluated by measurement of dislocation density. In Table 1, a symbol A indicates that the dislocation density is less than 5000 cm⁻², and a symbol B indicates that the dislocation density is 5000 cm⁻² or more.

TABLE 1

| Sample | a (mm) | b (mm) | c (mm) | r (mm) | Temperature difference | Crystalline quality |
|---|---|---|---|---|---|---|
| Sample 1 | 50 | 15 | 20 | 7.5 | 100° C. | A |
| Sample 2 | 60 | 15 | 20 | 7.5 | 85° C. | A |
| Sample 3 | 50 | 10 | 15 | 5 | 95° C. | A |
| Sample 4 | 50 | 15 | 25 | 7.5 | 80° C. | A |
| Sample 5 | 50 | 15 | 20 | 10 | 95° C. | A |
| Sample 6 | 40 | 15 | 10 | 4 | 120° C. | B |

Table 1 shows relation among shape parameters (distance a, distance b, shortest distance c and radius of curvature r) of resistive heater 10, the difference between the maximum temperature and the minimum temperature (temperature difference) in resistive heater 10, and the crystalline quality of the silicon carbide single crystal.

As shown in Table 1, the temperature difference in resistive heaters 10 according to samples 1 to 5 is 100° C. or less, and the temperature difference in resistive heater 10 according to sample 6 is 120° C. In addition, the silicon carbide single crystals manufactured with resistive heaters 10 according to samples 1 to 5 have good crystalline quality. The silicon carbide single crystal manufactured with resistive heater 10 according to sample 6 has lower crystalline quality than the crystalline qualities of the silicon carbide single crystals manufactured with apparatus 100 of manufacturing a silicon carbide single crystal according to samples 1 to 5. From these results, the crystalline quality of the silicon carbide single crystal can be improved by growing the silicon carbide single crystal with the temperature difference in resistive heater 10 being set to 100° C. or less.

<Clauses>

The above description includes features in the following clauses.

(Clause 1) An apparatus of manufacturing a silicon carbide single crystal according to the present disclosure includes a crucible, a resistive heater, and a power supply. The crucible has a top surface, a bottom surface opposite to the top surface, and a tubular side surface located between the top surface and the bottom surface. The resistive heater is provided outside of the crucible and made of carbon. The power supply is configured to be able to supply electric power to the resistive heater. The power supply and the resistive heater are configured such that, when a temperature of the resistive heater reaches a temperature of 2000° C. or more and 2400° C. or less or less due to a supply of electric power to the resistive heater from the power supply, a value obtained by dividing a value of a current flowing through the resistive heater by a cross-sectional area of the resistive heater perpendicular to a direction in which the current flows is 5 A/mm² or less. Consequently, degradation of the resistive heater can be suppressed.

(Clause 2) Preferably, in the apparatus of manufacturing a silicon carbide single crystal according to (Clause 1) above, carbon forming the resistive heater has a density of 1.7 g/cm³ or more and 1.9 g/cm³ or less.

(Clause 3) Preferably, in the apparatus of manufacturing a silicon carbide single crystal according to (Clause 1) or (Clause 2) above, the carbon forming the resistive heater has a resistivity of 1200 mΩ·cm or more.

(Clause 4) Preferably, in the apparatus of manufacturing a silicon carbide single crystal according to any one of (Clause 1) to (Clause 3) above, the resistive heater has a cross-sectional area of 100 mm² or more and 500 mm² or less.

(Clause 5) An apparatus of manufacturing a silicon carbide single crystal according to the present disclosure includes a crucible, a first resistive heater, a second resistive heater, a third resistive heater, a first power supply, a second power supply, and a third power supply. The crucible has a top surface, a bottom surface opposite to the top surface, and a tubular side surface located between the top surface and the bottom surface. The first resistive heater is provided to face the bottom surface and made of carbon. The second resistive heater is arranged to surround the side surface and made of carbon. The third resistive heater is provided to face the top surface and made of carbon. The first power supply is configured to be able to supply electric power to the first resistive heater. The second power supply is configured to be able to supply electric power to the second resistive heater. The third power supply is configured to be able to supply electric power to the third resistive heater. The first power supply and the first resistive heater are configured such that, when a temperature of the first resistive heater reaches a temperature of 2000° C. or more and 2400° C. or less due to a supply of electric power to the first resistive heater from the first power supply, a value obtained by dividing a value of a first current flowing through the first resistive heater by a first cross-sectional area of the first resistive heater perpendicular to a direction in which the first current flows is 5 A/mm² or less. The second power supply and the second resistive heater are configured such that, when a temperature of the second resistive heater reaches a temperature of 2000° C. or more and 2400° C. or less due to a supply of electric power to the second resistive heater from the second power supply, a value obtained by dividing a value of a second current flowing through the second resistive heater by a second cross-sectional area of the second resistive heater perpendicular to a direction in which the second current flows is 5 A/mm² or less. The third power supply and the third resistive heater are configured such that, when a temperature of the third resistive heater reaches a temperature of 2000° C. or more and 2400° C. or less due to a supply of electric power to the third resistive heater from the third power supply, a value obtained by dividing a value of a third current flowing through the third resistive heater by a third cross-sectional area of the third resistive heater perpendicular to a direction in which the third current flows is 5 A/mm² or less. Each of the first cross-sectional area, the second cross-sectional area and the third cross-sectional area is 100 mm² or more and 500 mm² or less. Carbon forming each of the first resistive heater, the second resistive heater and the third resistive heater has a density of 1.7 g/cm³ or more and 1.9 g/cm³ or less. The carbon forming each of the first resistive heater, the second resistive heater and the third resistive heater has a resistivity of 1200 mΩ·cm or more. Consequently, degradation of the first resistive heater, the second resistive heater and the third resistive heater can be suppressed.

(Clause 6) An apparatus of manufacturing a silicon carbide single crystal according to the present disclosure includes a crucible and a resistive heater. The crucible has a top surface, a bottom surface opposite to the top surface, and a tubular side surface located between the top surface and the bottom surface. The resistive heater is arranged to surround the side surface. The resistive heater has a first portion extending along a direction from the top surface toward the bottom surface, a second portion provided continuously with the first portion on the side close to the bottom surface and extending along a circumferential direction of the side surface, a third portion provided continuously with the second portion and extending along a direction from the bottom surface toward the top surface, and a fourth portion provided continuously with the third portion on the side close to the top surface and extending along the circumferential direction of the side surface. The resistive heater is configured such that, when an average temperature of the resistive heater is between 2000° C. or more and 2400° C. or less, a difference between a maximum temperature and a minimum temperature of the resistive heater is 100° C. or less. Consequently, the crystalline quality of the silicon carbide single crystal can be improved.

(Clause 7) Preferably, in the apparatus of manufacturing a silicon carbide single crystal according to (Clause 6) above, the first portion has a first surface facing the third portion, and a second surface opposite to the first surface. The third portion has a third surface facing the first surface, and a fourth surface opposite to the third surface. The second portion has a fifth surface located between the first surface and the third surface, and a sixth surface opposite to the fifth surface. Assuming that a distance between the second surface and the fourth surface in the circumferential direction is a, a distance between the first surface and the third surface in the circumferential direction is b, the shortest distance between the fifth surface and the sixth surface in the direction from the top surface toward the bottom surface is c, and a radius of curvature of the fifth surface when viewed along a direction perpendicular to the side surface is r, $a \geq 3b$, $c \geq b$, and $r \geq b/2$ are satisfied. Consequently, a local increase in temperature of the resistive heater can be suppressed.

(Clause 8) Preferably, in the apparatus of manufacturing a silicon carbide single crystal according to (Clause 6) or (Clause 7) above, the resistive heater is made of carbon, and the carbon has a density of 1.7 g/cm³ or more and 1.9 g/cm³ or less.

(Clause 9) Preferably, in the apparatus of manufacturing a silicon carbide single crystal according to (Clause 6) or (Clause 7) above, the resistive heater is made of carbon, and the carbon has a resistivity of 1200 mΩ·cm or more.

(Clause 10) An apparatus of manufacturing a silicon carbide single crystal according to the present disclosure includes a crucible and a resistive heater. The crucible has a top surface, a bottom surface opposite to the top surface, and a tubular side surface located between the top surface and the bottom surface. The resistive heater is arranged to surround the side surface. The resistive heater has a first portion extending along a direction from the top surface toward the bottom surface, a second portion provided continuously with the first portion on the side close to the bottom surface and extending along a circumferential direction of the side surface, a third portion provided continuously with the second portion and extending along a direction from the bottom surface toward the top surface, and a fourth portion provided continuously with the third portion on the side close to the top surface and extending along the circumferential direction of the side surface. The resistive heater is configured such that, when an average temperature of the resistive heater is between 2000° C. or more and 2400° C. or less, a difference between a maximum temperature and a minimum temperature of the resistive heater is 100° C. or less. The first portion has a first surface facing the third portion, and a second surface opposite to the first surface. The third portion has a third surface facing the first surface, and a fourth surface opposite to the third surface. The second portion has a fifth surface located between the first surface and the third surface, and a sixth surface opposite to the fifth surface. Assuming that a distance between the second surface and the fourth surface in the circumferential direction is a, a distance between the first surface and the third surface in the circumferential direction is b, the shortest distance between the fifth surface and the sixth surface in the direction from the top surface toward the bottom surface is c, and a radius of curvature of the fifth surface when viewed along a direction perpendicular to the side surface is r, a≥3b, c≥b, and r≥b/2 are satisfied. The resistive heater is made of carbon, and the carbon has a density of 1.7 g/cm$^3$ or more and 1.9 g/cm$^3$ or less and a resistivity of 1200 mΩ·cm or more. Consequently, the crystalline quality of the silicon carbide single crystal can be improved.

(Clause 11) A method of manufacturing a silicon carbide single crystal according to the present disclosure includes the following steps. A crucible having a top surface, a bottom surface opposite to the top surface, and a tubular side surface located between the top surface and the bottom surface, a resistive heater arranged to surround the side surface, a source material provided in the crucible, and a seed crystal provided to face the source material in the crucible are prepared. A silicon carbide single crystal is grown on the seed crystal by sublimating the source material with the resistive heater. In the step of growing a silicon carbide single crystal, a difference between a maximum temperature and a minimum temperature of the resistive heater is maintained at 100° C. or less. Consequently, the crystalline quality of the silicon carbide single crystal can be improved.

(Clause 12) Preferably, in the method of manufacturing a silicon carbide single crystal according to (Claus 11) above, in the step of growing a silicon carbide single crystal, an average temperature of the resistive heater is maintained at 2000° C. or more and 2400° C. or less.

(Clause 13) Preferably, the method of manufacturing a silicon carbide single crystal according to (Claus 11) or (Clause 12) above further includes a step of preparing a chamber that accommodates the crucible. In the step of growing a silicon carbide single crystal, a pressure in the chamber is maintained at 0.5 kPa or more and 2 kPa or less.

(Clause 14) A method of manufacturing a silicon carbide single crystal according to the present disclosure includes the following steps. A chamber, a crucible provided in the chamber and having a top surface, a bottom surface opposite to the top surface, and a tubular side surface located between the top surface and the bottom surface, a resistive heater provided in the chamber and arranged to surround the side surface, a source material provided in the crucible, and a seed crystal provided to face the source material in the crucible are prepared. A silicon carbide single crystal is grown on the seed crystal by sublimating the source material with the resistive heater. In the step of growing a silicon carbide single crystal, an average temperature of the resistive heater is 2000° C. or more and 2400° C. or less, a difference between a maximum temperature and a minimum temperature of the resistive heater is maintained at 100° C. or less, and a pressure in the chamber is maintained at 0.5 kPa or more and 2 kPa or less. Consequently, the crystalline quality of the silicon carbide single crystal can be improved.

(Clause 15) An apparatus of manufacturing a silicon carbide single crystal according to the present disclosure includes a crucible, a first resistive heater, a second resistive heater, and a first partition unit. The crucible has a top surface, a bottom surface opposite to the top surface, and a tubular side surface located between the top surface and the bottom surface. The first resistive heater is provided to face the bottom surface. The second resistive heater is arranged to surround the side surface. The first partition unit is provided so as to at least partially prevent radiant light from the second resistive heater from reaching the first resistive heater. The first partition unit is located outside of a portion of the side surface facing the second resistive heater. Consequently, temporal variation in temperature of the crucible can be suppressed.

(Claus 16) Preferably, in the apparatus of manufacturing a silicon carbide single crystal according to (Claus 15) above, the first partition unit is provided to project from the side surface to the outside of the crucible. Consequently, the first partition unit can be provided in a simple manner.

(Clause 17) Preferably, in the apparatus of manufacturing a silicon carbide single crystal according to (Claus 16) above, the first partition unit is provided to project from the entire circumference of the side surface to the outside of the crucible. Consequently, thermal conduction between the first resistive heater and the second resistive heater can be suppressed around the entire circumference.

(Clause 18) Preferably, in the apparatus of manufacturing a silicon carbide single crystal according to any one of (Claus 15) to (Claus 17) above, when viewed along a direction parallel to the bottom surface, a width of the first resistive heater is greater than a width of internal space of the crucible. Consequently, in-plane uniformity of the temperature of the bottom surface of the crucible can be improved.

(Clause 19) Preferably, in the apparatus of manufacturing a silicon carbide single crystal according to any one of (Claus 15) to (Claus 18) above, the second resistive heater has, in a direction from the top surface toward the bottom surface, a first surface located toward the top surface and a second surface located toward the bottom surface. When viewed along a direction perpendicular to the bottom surface, the first partition unit partially overlaps with the second surface. Consequently, thermal conduction between the first resistive heater and the second resistive heater can be further suppressed.

(Clause 20) Preferably, in the apparatus of manufacturing a silicon carbide single crystal according to any one of (Claus 15) to (Claus 19) above, the second resistive heater has a third surface facing the side surface, and a fourth surface opposite to the third surface. When viewed from the internal space of the crucible, in the direction parallel to the bottom surface, the fourth surface of the second resistive heater is located more distally than an outer end portion of the first partition unit, and the outer end portion of the first partition unit is located more distally than an outer end portion of the first resistive heater. Consequently, thermal conduction between the first resistive heater and the second resistive heater can be further suppressed.

(Clause 21) Preferably, the apparatus of manufacturing a silicon carbide single crystal according to any one of (Claus 15) to (Claus 20) above further includes a third resistive heater provided to face the top surface. Consequently, the temperature of the seed crystal can be accurately controlled.

(Clause 22) Preferably, the apparatus of manufacturing a silicon carbide single crystal according to (Claus 21) above further includes a second partition unit provided so as to at least partially prevent radiant light from the second resistive heater from reaching the third resistive heater. The second partition unit is located outside of a portion of the side surface facing the second resistive heater. Consequently, thermal conduction between the second resistive heater and the third resistive heater can be suppressed.

(Clause 23) Preferably, in the apparatus of manufacturing a silicon carbide single crystal according to (Claus 22) above, the second partition unit is provided to project from the side surface to the outside of the crucible. Consequently, the second partition unit can be provided in a simple manner.

(Clause 24) Preferably, in the apparatus of manufacturing a silicon carbide single crystal according to (Claus 23) above, the second partition unit is provided to project from the entire circumference of the side surface to the outside of the crucible. Consequently, thermal conduction between the second resistive heater and the third resistive heater can be suppressed around the entire circumference.

(Clause 25) Preferably, in the apparatus of manufacturing a silicon carbide single crystal according to any one of (Claus 15) to (Claus 24) above, the silicon carbide single crystal can be manufactured by sublimation. Consequently, the uniformity of crystalline quality of the silicon carbide single crystal manufactured by sublimation can be improved.

(Clause 26) An apparatus of manufacturing a silicon carbide single crystal according to the present disclosure is an apparatus of manufacturing a silicon carbide single crystal by sublimation, which includes a crucible, a first resistive heater, a second resistive heater, a third resistive heater, a first partition unit, and a second partition unit. The crucible has a top surface, a bottom surface opposite to the top surface, and a tubular side surface located between the top surface and the bottom surface. The first resistive heater is provided to face the bottom surface. The second resistive heater is arranged to surround the side surface. The third resistive heater is provided to face the top surface. The second resistive heater includes, in a direction from the top surface toward the bottom surface, a first surface located toward the top surface, a second surface located toward the bottom surface, a third surface facing the side surface, and a fourth surface opposite to the third surface. The first partition unit is located toward the second surface and provided to project from the entire circumference of the side surface to the outside of the crucible. The second partition unit is located toward the first surface and provided to project from the entire circumference of the side surface to the outside of the crucible. When viewed from internal space of the crucible, in a direction parallel to the bottom surface, the fourth surface of the second resistive heater is located more distally than at least one of the outer end portion of the first partition unit and the outer end portion of the second partition unit, and the at least one of the outer end portions is located more distally than an outer end portion of the first resistive heater. Consequently, temporal variation in temperature of the crucible can be further suppressed.

(Clause 27) A method of manufacturing a silicon carbide single crystal according to the present disclosure includes the following steps. A crucible having a top surface, a bottom surface opposite to the top surface, and a tubular side surface located between the top surface and the bottom surface, a first resistive heater provided to face the bottom surface, a second resistive heater arranged to surround the side surface, a partition unit located outside of a portion of the side surface facing the second resistive heater, a source material provided in the crucible, and a seed crystal provided to face the source material in the crucible are prepared. A silicon carbide single crystal is grown on the seed crystal by sublimating the source material. In the step of growing a silicon carbide single crystal, with the partition unit provided so as to at least partially prevent radiant light from the second resistive heater from reaching the first resistive heater, electric power supplied to the first resistive heater is determined based on a temperature of at least one of the bottom surface and the first resistive heater, and electric power supplied to the second resistive heater is determined based on a temperature of at least one of the side surface and the second resistive heater. Consequently, temporal variation in temperature of the crucible can be suppressed.

It should be understood that the embodiments disclosed herein are illustrative and non-restrictive in every respect. The scope of the present invention is defined by the terms of the claims, and is intended to include any modifications within the scope and meaning equivalent to the terms of the claims.

What is claimed is:

1. A method of manufacturing a silicon carbide single crystal, comprising steps of:
   preparing
   a crucible having a top surface, a bottom surface opposite to said top surface, and a tubular side surface located between said top surface and said bottom surface,
   a resistive heater provided outside of said crucible and made of carbon,
   wherein
   said resistive heater is arranged to surround said side surface,
   said resistive heater is configured of a plurality of heater units,
   each of said plurality of heater units has a first portion extending along a direction from said top surface toward said bottom surface, a second portion provided continuously with said first portion on a side close to said bottom surface and extending along a circumferential direction of said side surface, a third portion provided continuously with said second portion and extending along a direction from said bottom surface toward said top surface, and a fourth portion provided continuously with said third portion on a side close to said top surface and extending along said circumferential direction of said side surface,
   said first portion has a first surface facing said third portion,
   said third portion has a second surface facing said first surface,
   said second portion has a third surface located between said first surface and
   said second surface,
   said third surface has a curvature,
   a source material provided in said crucible, and
   a seed crystal provided to face said source material in said crucible; and
   growing a silicon carbide single crystal on said seed crystal by sublimating said source material with said resistive heater,
   in said step of growing a silicon carbide single crystal, a value obtained by dividing a value of a current flowing through said resistive heater by a cross-sectional area of said resistive heater perpendicular to a direction in which said current flows being maintained at 5 A/mm$^2$ or less.

2. The method of manufacturing a silicon carbide single crystal according to claim 1, wherein
   in said step of growing a silicon carbide single crystal, a temperature of said resistive heater is maintained at 2000° C. or more and 2400° C. or less.

3. The method of manufacturing a silicon carbide single crystal according to claim 1, further comprising a step of preparing a chamber that accommodates said crucible, wherein
in said step of growing a silicon carbide single crystal, a pressure in said chamber is maintained at 0.5 kPa or more and 2 kPa or less.

4. The method of manufacturing a silicon carbide single crystal according to claim 1, further comprising a step of preparing a chamber that accommodates said crucible, wherein
said resistive heater includes a first resistive heater provided to face said bottom surface in said chamber, a second resistive heater arranged to surround said side surface in said chamber, and a third resistive heater provided to face said top surface in said chamber, and
in said step of growing a silicon carbide single crystal,
a temperature of said first resistive heater is 2000° C. or more and 2400° C. or less, and a value obtained by dividing a value of a first current flowing through said first resistive heater by a first cross-sectional area of said first resistive heater perpendicular to a direction in which said first current flows is maintained at 5 A/mm$^2$ or less,
a temperature of said second resistive heater is 2000° C. or more and 2400° C. or less, and a value obtained by dividing a value of a second current flowing through said second resistive heater by a second cross-sectional area of said second resistive heater perpendicular to a direction in which said second current flows is maintained at 5 A/mm$^2$ or less,
a temperature of said third resistive heater is 2000° C. or more and 2400° C. or less, and a value obtained by dividing a value of a third current flowing through said third resistive heater by a third cross-sectional area of said third resistive heater perpendicular to a direction in which said third current flows is maintained at 5 A/mm$^2$ or less, and
a pressure in said chamber is maintained at 0.5 kPa or more and 2 kPa or less.

5. The method of manufacturing a silicon carbide single crystal according to claim 1, wherein said resistive heater is arranged to surround said side surface, and in said step of growing a silicon carbide single crystal, a difference between a maximum temperature and a minimum temperature of said resistive heater is maintained at 100° C. or less.

6. The method of manufacturing a silicon carbide single crystal according to claim 5, wherein
in said step of growing a silicon carbide single crystal, an average temperature of said resistive heater is maintained at 2000° C. or more and 2400° C. or less.

7. The method of manufacturing a silicon carbide single crystal according to claim 5, further comprising a step of preparing a chamber that accommodates said crucible, wherein
in said step of growing a silicon carbide single crystal, a pressure in said chamber is maintained at 0.5 kPa or more and 2 kPa or less.

8. The method of manufacturing a silicon carbide single crystal according to claim 5, further comprising a step of preparing a chamber that accommodates said crucible, wherein
in said step of growing a silicon carbide single crystal,
an average temperature of said resistive heater is 2000° C. or more and 2400° C. or less, and the difference between the maximum temperature and the minimum temperature of said resistive heater is maintained at 100° C. or less, and
a pressure in said chamber is maintained at 0.5 kPa or more and 2 kPa or less.

9. The method of manufacturing a silicon carbide single crystal according to claim 1, wherein
said resistive heater includes a first resistive heater provided to face said bottom surface, and a second resistive heater arranged to surround said side surface,
said method further comprises a step of preparing a partition unit located outside of a portion of said side surface facing said second resistive heater, and
in said step of growing a silicon carbide single crystal, with said partition unit provided so as to at least partially prevent radiant light from said second resistive heater from reaching said first resistive heater, electric power supplied to said first resistive heater is determined based on a temperature of at least one of said bottom surface and said first resistive heater, and electric power supplied to said second resistive heater is determined based on a temperature of at least one of said side surface and said second resistive heater.

* * * * *